(12) United States Patent
Kim

(10) Patent No.: US 10,804,901 B1
(45) Date of Patent: Oct. 13, 2020

(54) SIGNAL TRANSFER CIRCUIT AND SEMICONDUCTOR DEVICE INCLUDING THE SAME

(71) Applicant: SK hynix Inc., Gyeonggi-do (KR)

(72) Inventor: Hee-Jun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/708,664

(22) Filed: Dec. 10, 2019

(30) Foreign Application Priority Data

Apr. 9, 2019 (KR) .................. 10-2019-0041419

(51) Int. Cl.
*H03K 19/0185* (2006.01)
*H03K 3/356* (2006.01)

(52) U.S. Cl.
CPC .......... *H03K 19/018521* (2013.01); *H03K 3/356113* (2013.01)

(58) Field of Classification Search
CPC ............ H03K 19/018521; H03K 3/356113
See application file for complete search history.

(56) References Cited

U.S. PATENT DOCUMENTS

| 5,627,487 | A | * | 5/1997 | Keeth | ............ | H03K 19/0013 326/87 |
| 5,883,538 | A | * | 3/1999 | Keeth | ............ | G11C 8/08 326/81 |
| 6,160,437 | A | * | 12/2000 | Kim | ............ | H03K 17/08142 327/408 |
| 7,532,034 | B2 | | 5/2009 | Ker et al. | | |
| 8,212,590 | B2 | | 7/2012 | Wang et al. | | |
| 10,586,600 | B1 | * | 3/2020 | Yamada | ............ | G11C 16/30 |
| 2009/0040244 | A1 | * | 2/2009 | Lee | ............ | G09G 3/3696 345/690 |
| 2009/0160485 | A1 | * | 6/2009 | Rajagopal | ............ | H03K 19/0016 326/80 |
| 2011/0044077 | A1 | * | 2/2011 | Nielsen | ............ | H02M 5/4585 363/37 |
| 2011/0121860 | A1 | * | 5/2011 | Song | ............ | H03K 19/018514 326/80 |
| 2011/0199837 | A1 | * | 8/2011 | Reohr | ............ | G11C 8/08 365/189.06 |
| 2014/0184299 | A1 | * | 7/2014 | Chung | ............ | H03K 17/102 327/333 |
| 2014/0253210 | A1 | * | 9/2014 | Rajaee | ............ | H03K 19/01714 327/333 |
| 2014/0368252 | A1 | * | 12/2014 | Kim | ............ | H03K 19/018521 327/319 |

(Continued)

*Primary Examiner* — Adam D Houston
(74) *Attorney, Agent, or Firm* — IP & T Group LLP

(57) ABSTRACT

A signal transfer circuit for receiving a first signal to transfer the received first signal as a second signal by using an operating power source having a second voltage level, the signal transfer circuit may include: a first setting circuit; and a second setting circuit, the first signal may swing between a first voltage level and a ground level, and the second signal may swing between a third voltage level and the ground level, the first setting circuit may be configured to set the third voltage level to be same as the second voltage level, when the first voltage level is higher than the second voltage level, and the second setting circuit may be configured to set the third voltage level to be same as the first voltage level, by detecting when the first voltage level is lower than or equal to the second voltage level.

20 Claims, 8 Drawing Sheets

(56) References Cited

U.S. PATENT DOCUMENTS

| | | | |
|---|---|---|---|
| 2015/0200229 A1* | 7/2015 | Rotte | H04N 5/3597 |
| | | | 250/208.1 |
| 2015/0244954 A1* | 8/2015 | Shin | H04N 5/376 |
| | | | 250/208.1 |
| 2016/0085261 A1* | 3/2016 | Sanchez | G06F 1/32 |
| | | | 327/293 |
| 2016/0179125 A1* | 6/2016 | Im | G05F 5/00 |
| | | | 327/109 |
| 2018/0151146 A1* | 5/2018 | Chang | G11C 19/28 |
| 2018/0351357 A1* | 12/2018 | Feldtkeller | H02H 3/207 |
| 2019/0158091 A1* | 5/2019 | Dash | H03K 3/356104 |
| 2019/0265835 A1* | 8/2019 | Shin | G06F 3/04166 |
| 2020/0135073 A1* | 4/2020 | Kim | G06T 7/0004 |

\* cited by examiner

SIGNAL TRANSFER CIRCUIT AND SEMICONDUCTOR DEVICE INCLUDING THE SAME

CROSS-REFERENCE TO RELATED APPLICATION

This application claims priority under 35 U.S.C. § 119 to Korean Patent Application No. 10-2019-0041419 filed on Apr. 9, 2019, which is incorporated herein by reference in its entirety.

BACKGROUND

1. Field

Exemplary embodiments relate to a semiconductor design technology, and more particularly, to a semiconductor device including a signal transfer circuit.

2. Discussion of the Related Art

In general, semiconductor devices may include a plurality of circuits which operate using various operating power sources, depending on the expected functions thereof.

For example, a first circuit included in a semiconductor device may operate using a first power source having a first voltage level, and a second circuit included in the semiconductor device may operate using a second power source having a second voltage level. In this way, in a case where a plurality of circuits included in a single semiconductor device use operating power sources having different voltage levels, when signals are transmitted and received between the circuits, an error may be caused in that the signals transmitted and received are not precisely recognized.

SUMMARY

Various embodiments are directed to a signal transfer circuit for stably transmitting/receiving a signal between a plurality of circuits using various operating power sources having different voltage levels, and a semiconductor device including the signal transfer circuit.

Also, various embodiments are directed to a signal transfer circuit capable of detecting the difference between a voltage level of an operating power source and a voltage level of an input signal to multiplex a path through which the input signal is transmitted, depending on a detection result, thereby stably transmitting the input signal, and a semiconductor device including the signal transfer circuit.

In an embodiment, a signal transfer circuit for receiving a first signal to transfer the received first signal as a second signal by using an operating power source having a second voltage level, the signal transfer circuit may include: a first setting circuit; and a second setting circuit, the first signal may swing between a first voltage level and a ground level, and the second signal may swing between a third voltage level and the ground level, the first setting circuit may be configured to set the third voltage level to be same as the second voltage level, when the first voltage level is higher than the second voltage level, and the second setting circuit may be configured to set the third voltage level to be same as the first voltage level, by detecting when the first voltage level is lower than or equal to the second voltage level.

The first setting circuit may enter a mode for not disturbing an operation of the second setting circuit, when the first voltage level being lower than or equal to the second voltage level.

The second setting circuit may enter a mode for not disturbing an operation of the first setting circuit, by detecting when the first voltage level is higher than the second voltage level.

The second setting circuit may include: a first switch suitable for being controlled in response to a voltage level of a detection node between an input node for receiving the first signal and an output node for outputting the second signal; and a detection circuit suitable for setting a voltage level of the detection node by detecting a difference between the first voltage level and the second voltage level.

The detection circuit may set a voltage level of the detection node to a voltage level for turning on the first switch, by detecting when the first voltage level is lower than or equal to the second voltage level, and the detection circuit may set a voltage level of the detection node to a voltage level for turning off the first switch, by detecting when the first voltage level is higher than the second voltage level.

The second setting circuit may further include: a second switch suitable for coupling the input node and the output node by detecting when the first voltage level is lower than the second voltage level.

The first setting circuit may include: a first NMOS transistor having a gate terminal which is coupled to the input node, a drain terminal to which the operating power source is supplied, and a source terminal which is coupled to the output node.

The first switch may include: a first PMOS transistor having a source terminal which is coupled to the input node, a gate terminal which is coupled to the detection node, and a drain terminal which is coupled to the output node.

The second switch may include: a second NMOS transistor having a drain terminal which is coupled to the input node, a gate terminal to which the operating power source is supplied, and a source terminal which is coupled to the output node.

The detection circuit may include: a second PMOS transistor having a source terminal which is coupled to the input node, a gate terminal to which the operating power source is supplied, and a drain terminal to which the detection node is coupled; a third PMOS transistor having a source terminal to which the operating power source is supplied, a gate terminal which is coupled to the input node, and a drain terminal to which a first intermediate node is coupled; a fourth PMOS transistor having a source terminal which is coupled to the input node, a gate terminal to which the operating power source is supplied, and a drain terminal to which the first intermediate node is coupled; a third NMOS transistor having a drain terminal to which the detection node is coupled, a gate terminal to which the operating power source is supplied, and a source terminal to which a first sinking node is coupled; a fourth NMOS transistor having a drain terminal to which the operating power source is supplied, a gate terminal which is coupled to the first intermediate node, and a source terminal to which a second intermediate node is coupled; a fifth NMOS transistor having a drain terminal to which the first intermediate node is coupled, a gate terminal to which the operating power source is supplied, and a source terminal to which the second intermediate node is coupled; a fifth PMOS transistor having a source terminal to which the operating power source is supplied, a gate terminal which is coupled to the second intermediate node, and a drain terminal to which a second sinking node is coupled; a sixth NMOS transistor having a drain terminal to which the first sinking node is coupled and a gate terminal to which the second sinking node is coupled; a seventh NMOS transistor having a drain terminal to which a source terminal of the sixth NMOS transistor is coupled and a gate terminal to which the second sinking node is coupled; an eighth NMOS transistor having a drain terminal to which a source terminal of the seventh NMOS transistor is coupled, a gate terminal to which the first sinking node is coupled, and a source terminal to which a ground is coupled; a ninth NMOS transistor having a drain terminal to which the second sinking node is coupled and a gate terminal to which the first sinking node is coupled; and a tenth NMOS transistor having a drain terminal and a gate terminal to which a source terminal of the ninth NMOS transistor is coupled in common, and a source terminal which is coupled to the ground.

In an embodiment, a semiconductor device may include: a first integrated circuit configured to use a first operating power source having a first voltage level, and output a first signal swinging between the first voltage level and a ground level; and a second integrated circuit including a signal transfer circuit, and configured to perform a predetermined internal operation using a second operating power source having a second voltage level, the signal transfer circuit may be configured to receive the first signal and transfer the received first signal as a second signal swinging between a third voltage level and the ground level, the signal transfer circuit may include: a first setting circuit configured to set the third voltage level to be same as the second voltage level when the first voltage level is higher than the second voltage level; and a second setting circuit configured to set the third voltage level to be same as the first voltage level, by detecting when the first voltage level is lower than or equal to the second voltage level.

The first setting circuit may enter a mode for not disturbing an operation of the second setting circuit, in response to when the first voltage level is lower than or equal to the second voltage level.

The second setting circuit may enter a mode for not disturbing an operation of the first setting circuit, by detecting when the first voltage level is higher than the second voltage level.

The second setting circuit may include: a first switch configured to be controlled in response to a voltage level of a detection node between an input node for receiving the first signal and an output node for outputting the second signal; and a detection circuit configured to set a voltage level of the detection node by detecting a difference between the first voltage level and the second voltage level.

The detection circuit may set the detection node to a voltage level for turning on the first switch, by detecting when the first voltage level is lower than or equal to the second voltage level, and the detection circuit may set the detection node to a voltage level for turning off the first switch, by detecting when the first voltage level is higher than the second voltage level.

The second setting circuit may further include: a second switch configured to couple the input node and the output node by detecting when the first voltage level is lower than the second voltage level.

The first setting circuit may include: a first NMOS transistor having a gate terminal which is coupled to the input node, a drain terminal to which the second operating power source is inputted, and a source terminal which is coupled to the output node.

The first switch may include: a first PMOS transistor having a source terminal which is coupled to the input node, a gate terminal which is coupled to the detection node, and a drain terminal which is coupled to the output node.

The second switch may include: a second NMOS transistor having a drain terminal which is coupled to the input node, a gate terminal to which the second operating power source is inputted, and a source terminal which is coupled to the output node.

The detection circuit may include: a second PMOS transistor having a source terminal which is coupled to the input node, a gate terminal to which the second operating power source is inputted, and a drain terminal to which the detection node is coupled; a third PMOS transistor having a source terminal to which the second operating power source is inputted, a gate terminal which is coupled to the input node, and a drain terminal to which a first intermediate node is coupled; a fourth PMOS transistor having a source terminal which is coupled to the input node, a gate terminal to which the second operating power source is inputted, and a drain terminal to which the first intermediate node is coupled; a third NMOS transistor having a drain terminal to which the detection node is coupled, a gate terminal to which the second operating power source is inputted, and a source terminal to which a first sinking node is coupled; a fourth NMOS transistor having a drain terminal to which the second operating power source is inputted, a gate terminal which is coupled to the first intermediate node, and a source terminal to which a second intermediate node is coupled; a fifth NMOS transistor having a drain terminal to which the first intermediate node is coupled, a gate terminal to which the second operating power source is inputted, and a source terminal to which the second intermediate node is coupled; a fifth PMOS transistor having a source terminal to which the second operating power source is inputted, a gate terminal which is coupled to the second intermediate node, and a drain terminal to which a second sinking node is coupled; a sixth NMOS transistor having a drain terminal to which the first sinking node is coupled and a gate terminal to which the second sinking node is coupled; a seventh NMOS transistor having a drain terminal to which a source terminal of the sixth NMOS transistor is coupled and a gate terminal to which the second sinking node is coupled; an eighth NMOS transistor having a drain terminal to which a source terminal of the seventh NMOS transistor is coupled, a gate terminal to which the first sinking node is coupled, and a source terminal to which a ground is coupled; a ninth NMOS transistor having a drain terminal to which the second sinking node is coupled and a gate terminal to which the first sinking node is coupled; and a tenth NMOS transistor having a drain terminal and a gate terminal to which a source terminal of the ninth NMOS transistor is coupled in common, and a source terminal which is coupled to the ground.

Some advantages and effects according to the embodiments of the disclosure are as follows.

In the signal transfer circuit according to the embodiments of the disclosure, the difference between a voltage level of an operating power source and a voltage level of an input signal may be detected without using a separate control signal, and a path through which the input signal is transmitted may be multiplexed depending on a detection result, thereby allowing the input signal to be transmitted through a most stable path. Through this, the duty ratio of a signal outputted through the signal transfer circuit may be improved, and a noise margin may be secured. Also, the operational stability of a semiconductor device which performs an internal operation by using the signal outputted through the signal transfer circuit may be secured.

DETAILED DESCRIPTION

Figure 1:
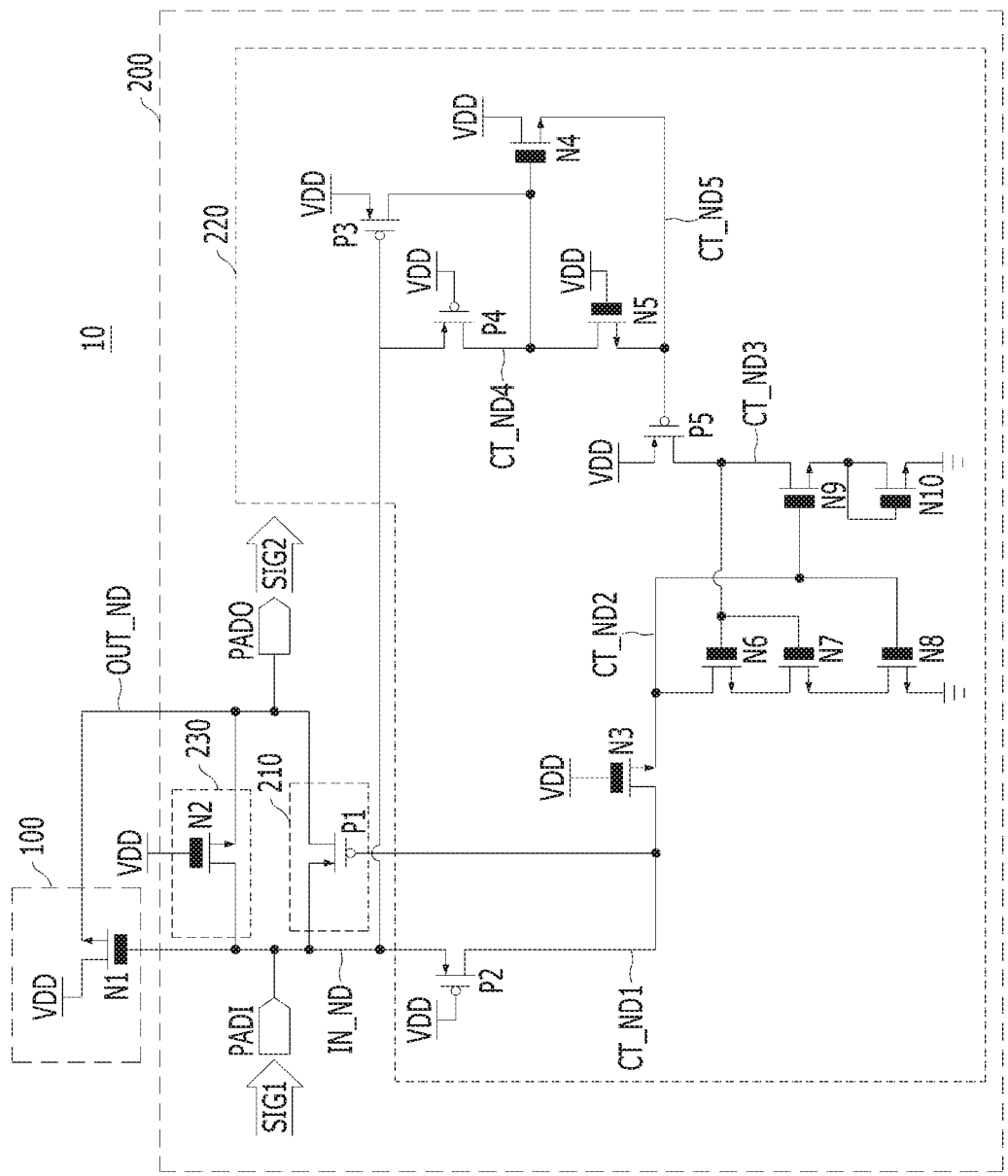
FIG. 1 is a diagram illustrating a signal transfer circuit in accordance with an embodiment of the disclosure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from context to be directed to a singular form.

FIG. 1 is a diagram illustrating a signal transfer circuit 10 in accordance with an embodiment of the disclosure.

Referring to FIG. 1, the signal transfer circuit 10 may include a first setting circuit 100 and a second setting circuit 200.

In detail, the signal transfer circuit 10 may receive a first signal SIG1 which swings between a first voltage level and a ground level, may be supplied with an operating power source VDD having a second voltage level, and may output a second signal SIG2 which swings between a third voltage level and the ground level.

The fact that the first signal SIG1 swings between the first voltage level and the ground level may mean that the first signal SIG1 may have the first voltage level to denote a logic value '1' and may have the ground level to denote a logic value '0.' Similarly, the fact that the second signal SIG2 swings between the third voltage level and the ground level may mean that the second signal SIG2 may have the third voltage level to denote a logic value '1' and may have the ground level to denote a logic value '0.'

The first setting circuit 100 may, when the first voltage level is higher than the second voltage level, set the third voltage level to be the same as the second voltage level. That is, the first setting circuit 100 may, when a voltage level of the first signal SIG1 inputted to the signal transfer circuit 10 is higher than a voltage level of the operating power source VDD, set a voltage level of the second signal SIG2 to be the same as the voltage level of the operating power source VDD.

The second setting circuit 200 may, by detecting a case when the first voltage level is lower than or equal to the second voltage level, set the third voltage level to be the same as the first voltage level. That is, the second setting circuit 200 may, by detecting a case when a voltage level of the first signal SIG1 inputted to the signal transfer circuit 10 is lower than or equal to a voltage level of the operating power source VDD, set a voltage level of the second signal SIG2 to be the same as the voltage level of the first signal SIG1.

The first setting circuit 100 may, when the first voltage level is lower than or equal to the second voltage level, enter a mode for not disturbing the operation of the second setting circuit 200. In other words, when a voltage level of the first signal SIG1 inputted to the signal transfer circuit 10 is lower than or equal to a voltage level of the operating power source VDD, because the second setting circuit 200 is required to operate as described above, the first setting circuit 100 should not disturb the operation of the second setting circuit 200. Therefore, the first setting circuit 100 may, when a voltage level of the first signal SIG1 inputted to the signal transfer circuit 10 is lower than or equal to a voltage level of the operating power source VDD, enter the mode for not disturbing the operation of the second setting circuit 200.

The second setting circuit 200 may, by detecting a case when the first voltage level is higher than the second voltage level, enter a mode for not disturbing the operation of the first setting circuit 100. In other words, when a voltage level of the first signal SIG1 inputted to the signal transfer circuit 10 is higher than a voltage level of the operating power source VDD, because the first setting circuit 100 is required to operate as described above, the second setting circuit 200 should not disturb the operation of the first setting circuit 100. Therefore, the second setting circuit 200 may, by detecting when a voltage level of the first signal SIG1 inputted to the signal transfer circuit 10 is higher than a voltage level of the operating power source VDD, enter the mode for not disturbing the operation of the first setting circuit 100.

The second setting circuit 200 may include a first switch 210, a second switch 230 and a detection circuit 220.

In detail, the first switch 210 may be controlled in response to a voltage level of a detection node CT_ND1 between an input node IN_ND for receiving the first signal SIG1 and an output node OUT_ND for outputting the second signal SIG2. Namely, the first switch 210 may be turned on according to a voltage level of the detection node CT_ND1, and thereby, may couple the input node IN_ND and the output node OUT_ND. On the other hand, the first switch 210 may be turned off according to a voltage level of the detection node CT_ND1, and thereby, may not couple the input node IN_ND and the output node OUT_ND.

The detection circuit 220 may set a voltage level of the detection node CT_ND1 by detecting a difference between the first voltage level and the second voltage level. That is, the detection circuit 220 may set a voltage level of the detection node CT_ND1 by detecting a difference between a voltage level of the first signal SIG1 inputted to the input node IN_ND through an input pad PADI and a voltage level of the operating power source VDD.

In further detail, the detection circuit 220 may set a voltage level of the detection node CT_ND1 to a voltage level for turning on the first switch 210, by detecting when the first voltage level is lower than or equal to the second voltage level. In other words, the detection circuit 220 may set a voltage level of the detection node CT_ND1 to a voltage level for turning on the first switch 210, by detecting when a voltage level of the first signal SIG1 is lower than or equal to a voltage level of the operating power source VDD.

Also, the detection circuit 220 may set a voltage level of the detection node CT_ND1 to a voltage level for turning off the first switch 210, by detecting when the first voltage level is higher than the second voltage level. In other words, the detection circuit 220 may set a voltage level of the detection node CT_ND1 to a voltage level for turning off the first switch 210, by detecting when a voltage level of the first signal SIG1 is higher than a voltage level of the operating power source VDD.

The second switch 230 may couple the input node IN_ND and the output node OUT_ND by detecting when the first voltage level is lower than the second voltage level. Namely, the second switch 230 may couple the input node IN_ND and the output node OUT_ND by detecting when a voltage level of the first signal SIG1 is lower than a voltage level of the operating power source VDD. The second switch 230 may couple the input node IN_ND and the output node OUT_ND by detecting when the first voltage level is lower than the second voltage level, regardless of the operations of the first switch 210 and the detection circuit 220.

It may be seen that the operation of the second switch 230 partially overlaps with the operation of the first switch 210. In detail, as described above, the first switch 210 may operate to couple the input node IN_ND and the output node OUT_ND, when it is detected that the first voltage level is lower than or equal to the second voltage level. Also, as described above, the second switch 230 may operate to couple the input node IN_ND and the output node OUT_ND, when it is detected that the first voltage level is lower than the second voltage level. Thus, the second switch 230 may assist the operation of the first switch 210 by coupling the input node IN_ND and the output node OUT_ND when it is detected that the first voltage level is lower than the second voltage level.

The first setting circuit 100 may include a first NMOS transistor N1 having a gate terminal which is coupled to the input node IN_ND, a drain terminal to which the operating power source VDD is inputted, and a source terminal which is coupled to the output node OUT_ND.

The first switch 210 may include a first PMOS transistor P1 having a source terminal which is coupled to the input node IN_ND, a gate terminal which is coupled to the detection node CT_ND1, and a drain terminal which is coupled to the output node OUT_ND.

The second switch 230 may include a second NMOS transistor N2 having a drain terminal which is coupled to the input node IN_ND, a gate terminal to which the operating power source VDD is inputted, and a source terminal which is coupled to the output node OUT_ND.

The detection circuit 220 may include a second PMOS transistor P2, a third PMOS transistor P3, a fourth PMOS transistor P4, a fifth PMOS transistor P5, a third NMOS transistor N3, a fourth NMOS transistor N4, a fifth NMOS transistor N5, a sixth NMOS transistor N6, a seventh NMOS transistor N7, an eighth NMOS transistor N8, a ninth NMOS transistor N9 and a tenth NMOS transistor N10.

The second PMOS transistor P2 may have a source terminal which is coupled to the input node IN_ND, a gate terminal to which the operating power source VDD is inputted, and a drain terminal to which the detection node CT_ND1 is coupled.

The third PMOS transistor P3 may have a source terminal to which the operating power source VDD is inputted, a gate terminal which is coupled to the input node IN_ND, and a drain terminal to which a first intermediate node CT_ND4 is coupled.

The fourth PMOS transistor P4 may have a source terminal which is coupled to the input node IN_ND, a gate terminal to which the operating power source VDD is inputted, and a drain terminal to which the first intermediate node CT_ND4 is coupled.

The third NMOS transistor N3 may have a drain terminal to which the detection node CT_ND1 is coupled, a gate terminal to which the operating power source VDD is inputted, and a source terminal to which a first sinking node CT_ND2 is coupled.

The fourth NMOS transistor N4 may have a drain terminal to which the operating power source VDD is inputted, a gate terminal which is coupled to the first intermediate node CT_ND4, and a source terminal to which a second intermediate node CT_ND5 is coupled.

The fifth NMOS transistor N5 may have a drain terminal to which the first intermediate node CT_ND4 is coupled, a gate terminal to which the operating power source VDD is inputted, and a source terminal to which the second intermediate node CT_ND5 is coupled.

The fifth PMOS transistor P5 may have a source terminal to which the operating power source VDD is inputted, a gate terminal which is coupled to the second intermediate node CT_ND5, and a drain terminal to which a second sinking node CT_ND3 is coupled.

The sixth NMOS transistor N6 may have a drain terminal to which the first sinking node CT_ND2 is coupled and a gate terminal to which the second sinking node CT_ND3 is coupled.

The seventh NMOS transistor N7 may have a drain terminal to which a source terminal of the sixth NMOS transistor N6 is coupled and a gate terminal to which the second sinking node CT_ND3 is coupled.

The eighth NMOS transistor N8 may have a drain terminal to which a source terminal of the seventh NMOS transistor N7 is coupled, a gate terminal to which the first sinking node CT_ND2 is coupled, and a source terminal to which a ground is coupled.

The ninth NMOS transistor N9 may have a drain terminal to which the second sinking node CT_ND3 is coupled and a gate terminal to which the first sinking node CT_ND2 is coupled.

The tenth NMOS transistor N10 may have a drain terminal and a gate terminal to which a source terminal of the ninth NMOS transistor N9 is coupled in common and a source terminal which is coupled to the ground.

Figure 2:
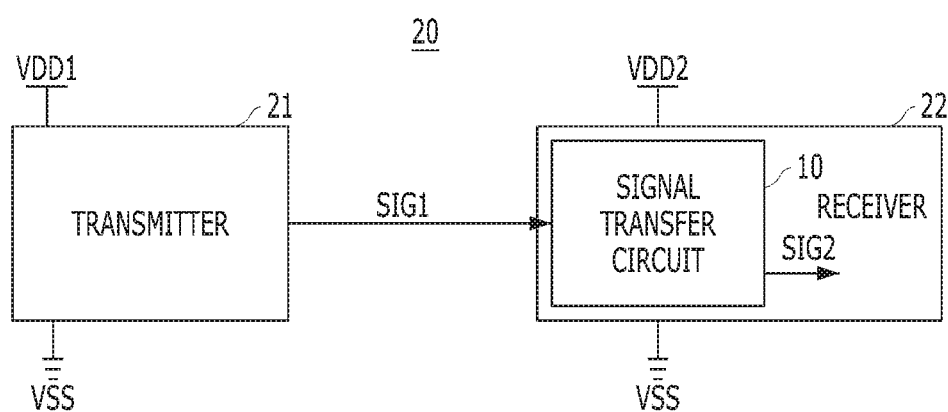
FIG. 2 is a diagram schematically illustrating a semiconductor device including the signal transfer circuit shown in FIG. 1.

FIG. 2 is a diagram schematically illustrating a semiconductor device 20 including the signal transfer circuit 10 shown in FIG. 1.

Referring to FIG. 2, the semiconductor device 20 may include a first integrated circuit (IC) 21 and a second integrated circuit 22. The second integrated circuit 22 may include the signal transfer circuit of FIG. 1.

In detail, the first integrated circuit 21 may be supplied with a first operating power source VDD1 which has the first voltage level, and may output a first signal SIG1 which swings between the first voltage level and a ground level.

The second integrated circuit 22 may be supplied with a second operating power source VDD2 which has the second voltage level, and may perform a predetermined internal operation using second signal SIG2 which swings between a third voltage level and the ground level and is transferred through the signal transfer circuit included therein. Since the signal transfer circuit 10 is included in the second integrated circuit 22, the signal transfer circuit 10 may also be supplied with the second operating power source VDD2.

The signal transfer circuit 10 included in the second integrated circuit 22 may receive the first signal SIG1 which swings between the first voltage level and the ground level, and is outputted from the first integrated circuit 21 and is inputted to the second integrated circuit 22, and may output the second signal SIG2 which swings between the third voltage level and the ground level. The signal transfer circuit 10 included in the second integrated circuit 22 is completely the same as the signal transfer circuit 10 described above with reference to FIG. 1. Therefore, further detailed description thereof will be omitted herein.

Figure 3:
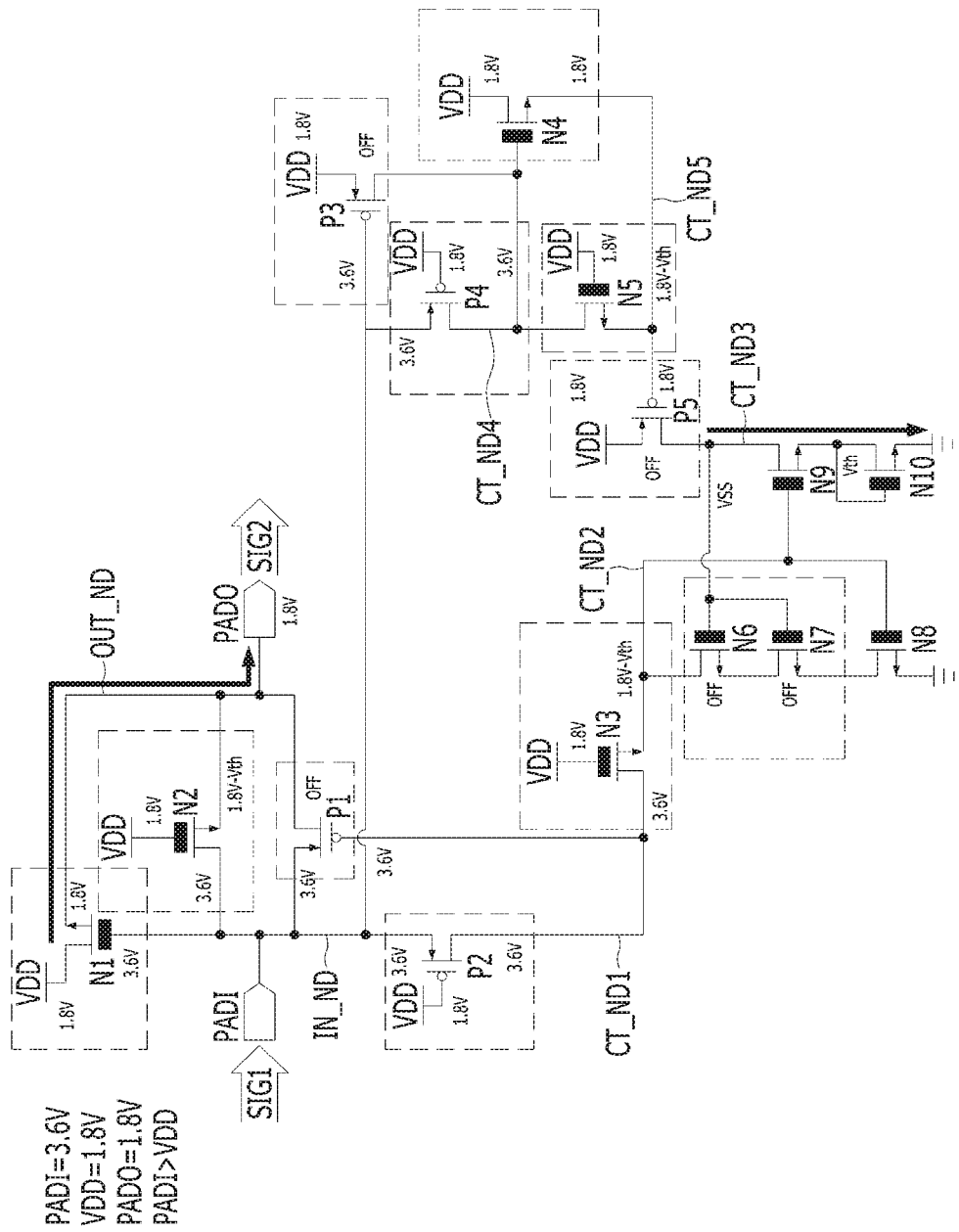
FIGS. 3 to 8 are diagrams for describing operations of the signal transfer circuit shown in FIG. 1.

FIG. 3 is a diagram for describing a first operation of the signal transfer circuit 10 shown in FIG. 1.

Referring to FIG. 3, the first signal SIG1 having a voltage level of 3.6V is inputted to the signal transfer circuit 10 through the input pad PADI. Also, the signal transfer circuit 10 is supplied with the operating power source VDD of 1.8V. Therefore, in FIG. 3, the voltage level of the first signal SIG1 inputted to the signal transfer circuit 10 is higher than the voltage level of the operating power source VDD.

The first setting circuit 100 included in the signal transfer circuit 10 may, when the voltage level of the first signal SIG1 is higher than the voltage level of the operating power source VDD, convert the first signal SIG1 inputted through the input pad PADI into the second signal SIG2 and transmit the second signal SIG2 to an output pad PADO. Here, the second signal SIG2 may have a voltage level of 1.8V. That is, the voltage level of the second signal SIG2 may be the same as the voltage level of the operating power source VDD supplied to the signal transfer circuit 10.

The second setting circuit 200 included in the signal transfer circuit 10 may, by detecting when the voltage level of the first signal SIG1 is higher than the voltage level of the operating power source VDD, enter the mode for not disturbing the operation of the first setting circuit 100.

In detail, if the first signal SIG1 having the voltage level of 3.6V is inputted through the input pad PADI, a voltage level of the input node IN_ND may be 3.6V.

The first setting circuit 100 may, when the voltage level of the input node IN_ND is 3.6V, transmit the operating power source VDD of 1.8V to the output node OUT_ND, as it is. In other words, the first NMOS transistor N1 included in the first setting circuit 100 may, when the voltage of 3.6V loaded on the input node IN_ND is inputted to the gate terminal thereof, transmit the operating power source VDD of 1.8V inputted to the drain terminal thereof, to the output node OUT_ND coupled with the source terminal thereof, as it is. Therefore, a voltage level of the output node OUT_ND may become 1.8V as the voltage level of the operating power source VDD, and may be outputted as the second signal SIG2 through the output pad PADO.

The second switch 230 included in the second setting circuit 200 may, when the operating power source VDD is 1.8V, transmit a voltage having a magnitude of 1.8V-Vth lower than 1.8V in the voltage of 3.6V loaded on the input node IN_ND, to the output node OUT_ND. Namely, the second NMOS transistor N2 included in the second switch 230 may, in response to the operating power source VDD of 1.8V inputted to the gate terminal thereof, transmit the voltage having the magnitude of 1.8V-Vth lower than 1.8V in the voltage of 3.6V loaded on the input node IN_ND coupled with the drain terminal thereof, to the output node OUT_ND coupled with the source terminal thereof. Because a voltage transmitted from the input node IN_ND to the output node OUT_ND through the operation of the second switch 230 has the magnitude of 1.8V-Vth lower than 1.8V, the operation of the second switch 230 may not disturb the operation of the first setting circuit 100.

The detection circuit 220 included in the second setting circuit 200 may, when the voltage level of the input node IN_ND is 3.6V, maintain a voltage level of the detection node CT_ND1 at 3.6V, thereby allowing the first switch 210 to maintain a turned-off state. Thus, the first switch 210 does not transmit the voltage of 3.6V loaded on the input node IN_ND, to the output node OUT_ND. Namely, because the first PMOS transistor P1 included in the first switch 210 is turned off when the voltage level of 3.6V loaded on the detection node CT_ND1 is inputted to the gate terminal thereof, the first PMOS transistor P1 cannot transmit the voltage of 3.6V loaded on the input node IN_ND coupled to the source terminal thereof, to the output node OUT_ND coupled to the drain terminal thereof. In this way, because the first switch 210 is turned off, the operation of the first switch 210 may not disturb the operation of the first setting circuit 100. As described above, because the operations of the first switch 210 and the second switch 230 included in the second setting circuit 200 do not disturb the operation of the first setting circuit 100, it may be seen that the operation of the second setting circuit 200 does not disturb the operation of the first setting circuit 100.

In detail, the operation of the detection circuit 220 included in the second setting circuit 200 will be described hereunder.

First, the second PMOS transistor P2 may, in response to the operating power source VDD of 1.8V inputted to the gate terminal thereof, transmit the voltage of 3.6V loaded on the input node IN_ND coupled with the source terminal thereof, to the detection node CT_ND1 coupled with the drain terminal thereof, as it is.

The third NMOS transistor N3 may, in response to the operating power source VDD of 1.8V inputted to the gate terminal thereof, transmit a voltage having a magnitude of 1.8V-Vth lower than 1.8V in the voltage of 3.6V loaded on the detection node CT_ND1 coupled with the drain terminal thereof, to the first sinking node CT_ND2 coupled with the source terminal thereof.

The fourth PMOS transistor P4 may, in response to the operating power source VDD of 1.8V inputted to the gate terminal thereof, transmit the voltage of 3.6V loaded on the input node IN_ND coupled with the source terminal thereof, to the first intermediate node CT_ND4 coupled with the drain terminal thereof, as it is.

The third PMOS transistor P3 is turned off when the voltage of 3.6V loaded on the input node IN_ND is inputted to the gate terminal thereof, and therefore, cannot transmit the operating power source VDD of 1.8V inputted to the source terminal thereof, to the first intermediate node CT_ND4.

By the operations of the third PMOS transistor P3 and the fourth PMOS transistor P4, the first intermediate node CT_ND4 may be determined to have a voltage level of 3.6V.

The fourth NMOS transistor N4 may, when the voltage of 3.6V loaded on the first intermediate node CT_ND4 is inputted to the gate terminal thereof, transmit the operating power source VDD of 1.8V inputted to the drain terminal thereof, to the second intermediate node CT_ND5 coupled with the source terminal thereof, as it is.

The fifth NMOS transistor N5 may, in response to the operating power source VDD of 1.8V inputted to the gate terminal thereof, transmit a voltage having a magnitude of 1.8V-Vth lower than 1.8V in the voltage of 3.6V loaded on the first intermediate node CT_ND4 coupled with the drain terminal thereof, to the second intermediate node CT_ND5 coupled with the source terminal thereof.

Because a voltage transmitted from the first intermediate node CT_ND4 to the second intermediate node CT_ND5 through the operation of the fifth NMOS transistor N5 has the magnitude of 1.8V-Vth lower than 1.8V and a voltage transmitted from the first intermediate node CT_ND4 to the second intermediate node CT_ND5 through the operation of the fourth NMOS transistor N4 is 1.8V, the second intermediate node CT_ND5 may be determined to a state in which it has a voltage level of 1.8V.

The fifth PMOS transistor P5 is turned off when the voltage of 1.8V loaded on the second intermediate node CT_ND5 is inputted to the gate terminal thereof, and therefore, cannot transmit the operating power source VDD of 1.8V inputted to the source terminal thereof, to the second sinking node CT_ND3.

The ninth NMOS transistor N9 is turned on when the voltage having the magnitude of 1.8V-Vth lower than 1.8V loaded on the first sinking node CT_ND2 is inputted to the gate terminal thereof, and therefore, may couple the second sinking node CT_ND3 coupled to the drain terminal thereof, with the gate terminal and the drain terminal of the tenth NMOS transistor N10 coupled to the source terminal thereof.

Because a terminal of a ground voltage VSS is coupled to the source terminal of the tenth NMOS transistor N10, the second sinking node CT_ND3 may be determined to a state in which it has a level of the ground voltage VSS, through the operations of the ninth NMOS transistor N9 and the tenth NMOS transistor N10.

The sixth NMOS transistor N6 may be turned off when the ground voltage VSS loaded on the second sinking node CT_ND3 is inputted to the gate terminal thereof. The seventh NMOS transistor N7 may also be turned off when the ground voltage VSS loaded on the second sinking node CT_ND3 is inputted to the gate terminal thereof. Thus, even though the eighth NMOS transistor N8 is turned on when the voltage having the magnitude of 1.8V-Vth lower than 1.8V loaded on the first sinking node CT_ND2 is inputted to the gate terminal thereof, the first sinking node CT_ND2 may be determined to a state in which it has the voltage having the magnitude of 1.8V-Vth lower than 1.8V determined by the third NMOS transistor N3.

By the above-described operations of the third NMOS transistor N3, the sixth NMOS transistor N6, the seventh NMOS transistor N7 and the eighth NMOS transistor N8, the detection node CT_ND1 may be determined to a state in which it has the voltage of 3.6V determined by the second PMOS transistor P2.

Figure 4:
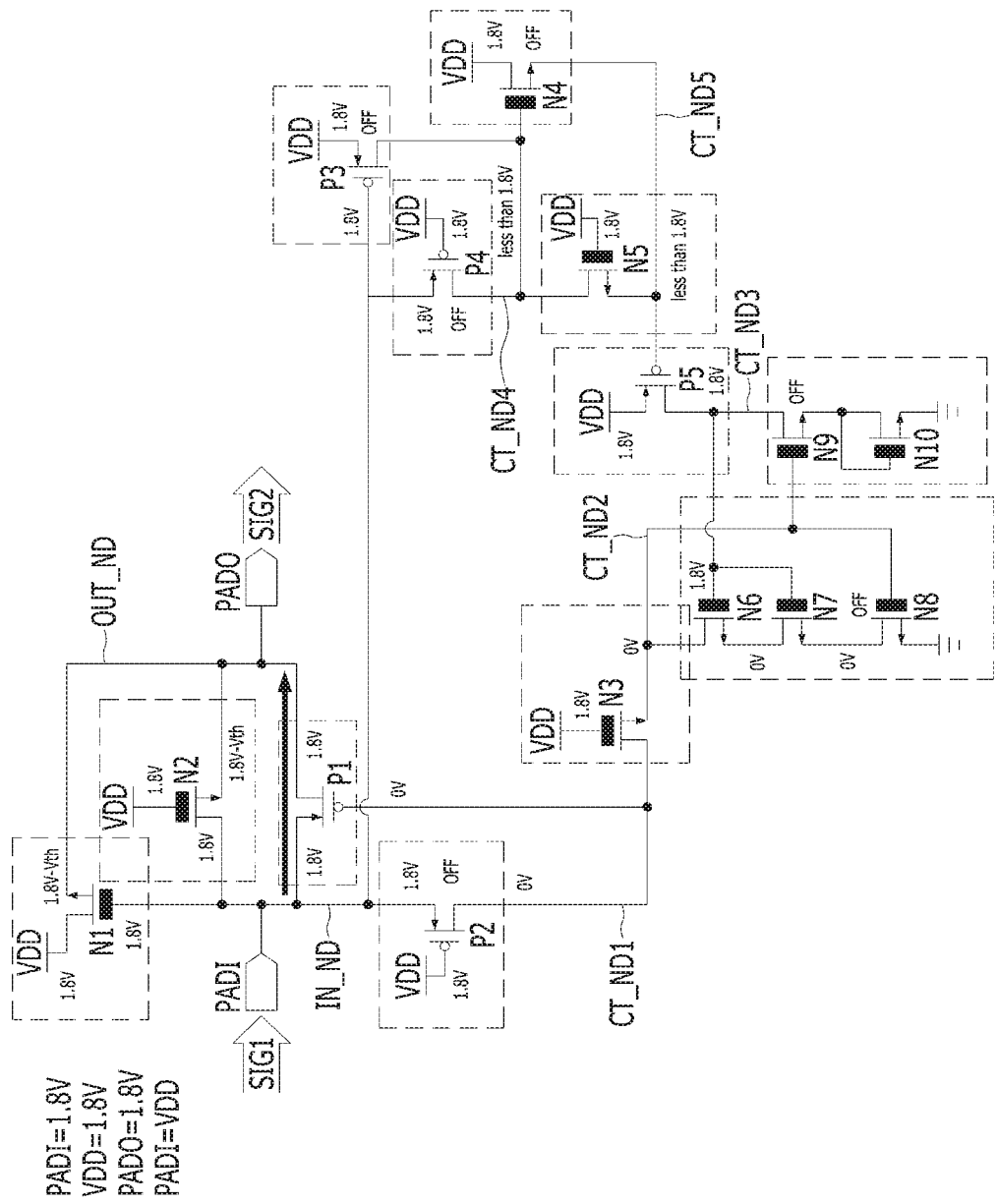

FIG. 4 is a diagram for describing a second operation of the signal transfer circuit 10 shown in FIG. 1.

Referring to FIG. 4, the first signal SIG1 having a voltage level of 1.8V is inputted to the signal transfer circuit 10 through the input pad PADI. Also, the signal transfer circuit 10 is supplied with the operating power source VDD of 1.8V. Therefore, in FIG. 4, the voltage level of the first signal SIG1 inputted to the signal transfer circuit 10 is equal to the voltage level of the operating power source VDD.

The second setting circuit 200 included in the signal transfer circuit 10 may detect the state in which the voltage level of the first signal SIG1 is equal to the voltage level of the operating power source VDD, and according to the detection result, may convert the first signal SIG1 inputted through the input pad PADI into the second signal SIG2 and transmit the second signal SIG2 to the output pad PADO. Here, the second signal SIG2 may have a voltage level of 1.8V. That is, the voltage level of the second signal SIG2 may be the same as the voltage level of the first signal SIG1.

The first setting circuit 100 included in the signal transfer circuit 10 may, when the voltage level of the first signal SIG1 is equal to the voltage level of the operating power source VDD, enter the mode for not disturbing the operation of the second setting circuit 200.

In detail, if the first signal SIG1 having the voltage level of 1.8V is inputted through the input pad PADI, a voltage level of the input node IN_ND may be 1.8V.

The detection circuit 220 included in the second setting circuit 200 may, when the voltage level of the input node IN_ND is 1.8V, maintain a voltage level of the detection node CT_ND1 at 0V, thereby allowing the first switch 210 to maintain a turned-on state. Thus, the first switch 210 may transmit the voltage of 1.8V loaded on the input node IN_ND, to the output node OUT_ND, as it is. Namely, because the first PMOS transistor P1 included in the first switch 210 is turned on when the voltage level of 0V loaded on the detection node CT_ND1 is inputted to the gate terminal thereof, the first PMOS transistor P1 may transmit the voltage of 1.8V loaded on the input node IN_ND coupled to the source terminal thereof, to the output node OUT_ND coupled to the drain terminal thereof, as it is. Therefore, a voltage level of the output node OUT_ND may become 1.8V as the voltage level of the first signal SIG1, and may be outputted as the second signal SIG2 through the output pad PADO.

The second switch 230 included in the second setting circuit 200 may, when the operating power source VDD is 1.8V, transmit a voltage having a magnitude of 1.8V-Vth lower than 1.8V in the voltage of 1.8V loaded on the input node IN_ND, to the output node OUT_ND. Namely, the second NMOS transistor N2 included in the second switch 230 may, in response to the operating power source VDD of 1.8V inputted to the gate terminal thereof, transmit the voltage having the magnitude of 1.8V-Vth lower than 1.8V in the voltage of 1.8V loaded on the input node IN_ND coupled with the drain terminal thereof, to the output node OUT_ND coupled with the source terminal thereof. Because a voltage transmitted from the input node IN_ND to the output node OUT_ND through the operation of the second switch 230 has the magnitude of 1.8V-Vth lower than 1.8V, the operation of the second switch 230 may not disturb the operation of the first switch 210.

The first setting circuit 100 may, when the voltage level of the input node IN_ND is 1.8V, transmit a voltage having a magnitude of 1.8V-Vth lower than 1.8V in the operating power source VDD of 1.8V, to the output node OUT_ND. In other words, the first NMOS transistor N1 included in the first setting circuit 100 may, when the voltage of 1.8V loaded on the input node IN_ND is inputted to the gate terminal thereof, transmit the voltage having the magnitude of 1.8V-Vth lower than 1.8V in the operating power source VDD of 1.8V inputted to the drain terminal thereof, to the output node OUT_ND coupled with the source terminal thereof. Because a voltage transmitted from the input node IN_ND to the output node OUT_ND through the operation of the first setting circuit 100 has the magnitude of 1.8V-Vth lower than 1.8V, the operation of the first setting circuit 100 may not disturb the operation of the second setting circuit 200.

In detail, the operation of the detection circuit 220 included in the second setting circuit 200 will be described hereunder.

First, the second PMOS transistor P2 may be turned off because the operating power source VDD of 1.8V inputted to the gate terminal thereof and the voltage of 1.8V loaded on the input node IN_ND coupled with the source terminal thereof are the same with each other. Therefore, through the second PMOS transistor P2, the voltage of 1.8V loaded on the input node IN_ND coupled to the source terminal thereof cannot be transmitted to the detection node CT_ND1 coupled with the drain terminal thereof. Hence, in a state in which only the operation of the second PMOS transistor P2 is performed, the detection node CT_ND1 may be in a floating state in which a voltage level thereof cannot be specified. However, from the fact that the voltage level of the first signal SIG1 is 1.8V, the first signal SIG1 swings between 0V and 1.8V. Because the second PMOS transistor P2 receives the operating power source VDD of 1.8V through the gate terminal thereof, the second PMOS transistor P2 always maintains a turned-off state regardless of the fact that the first signal SIG1 swings between 0V and 1.8V. Hence, in a state in which only the operation of the second PMOS transistor P2 is performed, the detection node CT_ND1 may be in a floating state close to 0V as the level of the ground voltage VSS.

Also, even though the third NMOS transistor N3 receives the operating power source VDD of 1.8V through the gate terminal thereof, since the detection node CT_ND1 coupled with the drain terminal thereof is in the floating state close to 0V as the level of the ground voltage VSS, the first sinking node CT_ND2 coupled to the source terminal thereof may also be in a floating state close to 0V as the level of the ground voltage VSS.

Further, the fourth PMOS transistor P4 may be turned off because the operating power source VDD of 1.8V inputted to the gate terminal thereof and the voltage of 1.8V loaded on the input node IN_ND coupled with the source terminal thereof are the same as each other. Therefore, through the fourth PMOS transistor P4, the voltage of 1.8V loaded on the input node IN_ND coupled to the source terminal thereof cannot be transmitted to the first intermediate node CT_ND4 coupled with the drain terminal thereof.

The third PMOS transistor P3 may be turned off because the voltage of 1.8V loaded on the input node IN_ND and inputted to the gate terminal thereof and the operating power source VDD of 1.8V inputted to the source terminal thereof are the same as each other. Therefore, through the third PMOS transistor P3, the operating power source VDD of 1.8V inputted to the source terminal thereof cannot be transmitted to the first intermediate node CT_ND4. Hence, in a state in which only the operations of the third PMOS transistor P3 and the fourth PMOS transistor P4 are performed, the first intermediate node CT_ND4 may be in a floating state in which a voltage level thereof cannot be specified. However, from the fact that the voltage level of the first signal SIG1 is 1.8V, the first signal SIG1 swings between 0V and 1.8V. Because the third PMOS transistor P3 receives the voltage of 1.8V loaded on the input node IN_ND, through the gate terminal thereof, the third PMOS transistor P3 may be switched between a turned-on state and a turned-off state when the first signal SIG1 swings between 0V and 1.8V. Hence, in a state in which only the operations of the third PMOS transistor P3 and the fourth PMOS transistor P4 are performed, the first intermediate node CT_ND4 may be in a floating state in which it has a voltage level lower than 1.8V.

In other words, due to the operations of the third PMOS transistor P3 and the fourth PMOS transistor P4, the first intermediate node CT_ND4 may be determined to a floating state in which it has a voltage level lower than 1.8V.

The fourth NMOS transistor N4 may be turned off when the voltage having the voltage level lower than 1.8V loaded on the first intermediate node CT_ND4 is inputted to the gate terminal thereof. Namely, through the fourth NMOS transistor N4, the operating power source VDD of 1.8V inputted to the drain terminal thereof cannot be transmitted to the second intermediate node CT_ND5 coupled with the source terminal thereof.

The fifth NMOS transistor N5 may, in response to the operating power source VDD of 1.8V inputted to the gate terminal thereof, transmit the voltage having the voltage level lower than 1.8V loaded on the first intermediate node CT_ND4 coupled with the drain terminal thereof, to the second intermediate node CT_ND5 coupled with the source terminal thereof, as it is.

Through the operations of the fourth NMOS transistor N4 and the fifth NMOS transistor N5, the second intermediate node CT_ND5 may be determined to a floating state in which it has a voltage level lower than 1.8V.

The fifth PMOS transistor P5 may, when the voltage having the voltage level lower than 1.8V loaded on the second intermediate node CT_ND5 is inputted to the gate terminal thereof, transmit the operating power source VDD of 1.8V inputted to the source terminal thereof, to the second sinking node CT_ND3, as it is.

The ninth NMOS transistor N9 is turned off when the voltage close to 0V as the level of the ground voltage VSS loaded on the first sinking node CT_ND2 is inputted to the gate terminal thereof, and therefore, may not couple the second sinking node CT_ND3 coupled to the drain terminal thereof, with the gate terminal and the drain terminal of the tenth NMOS transistor N10 coupled to the source terminal thereof. Thus, even in a state in which a voltage of the second sinking node CT_ND3 is sufficiently high, it is possible to prevent the occurrence of leakage current.

Although the terminal of the ground voltage VSS is coupled to the source terminal of the tenth NMOS transistor N10, because the ninth NMOS transistor N9 is turned off, the second sinking node CT_ND3 may be determined to a state in which it has a voltage level of 1.8V, through the operations of the fifth PMOS transistor P5, the ninth NMOS transistor N9 and the tenth NMOS transistor N10.

The sixth NMOS transistor N6 may be turned on when the voltage of 1.8V loaded on the second sinking node CT_ND3 is inputted to the gate terminal thereof. The seventh NMOS transistor N7 may also be turned on when the voltage of 1.8V loaded on the second sinking node CT_ND3 is inputted to the gate terminal thereof. The eighth NMOS transistor N8 is turned off when the voltage close to 0V as the level of the ground voltage VSS loaded on the first sinking node CT_ND2 is inputted to the gate terminal thereof, and therefore, may not couple the source terminal of the seventh NMOS transistor N7 with the ground voltage VSS. Therefore, the first sinking node CT_ND2 which is in the floating state close to 0V due to the operations of the second PMOS transistor P2 and the third NMOS transistor N3 may be determined to be 0V through the operations of the sixth NMOS transistor N6, the seventh NMOS transistor N7 and the eighth NMOS transistor N8.

By the above-described operations of the third NMOS transistor N3, the sixth NMOS transistor N6, the seventh NMOS transistor N7 and the eighth NMOS transistor N8, the detection node CT_ND1 may be determined to be 0V.

Figure 5:
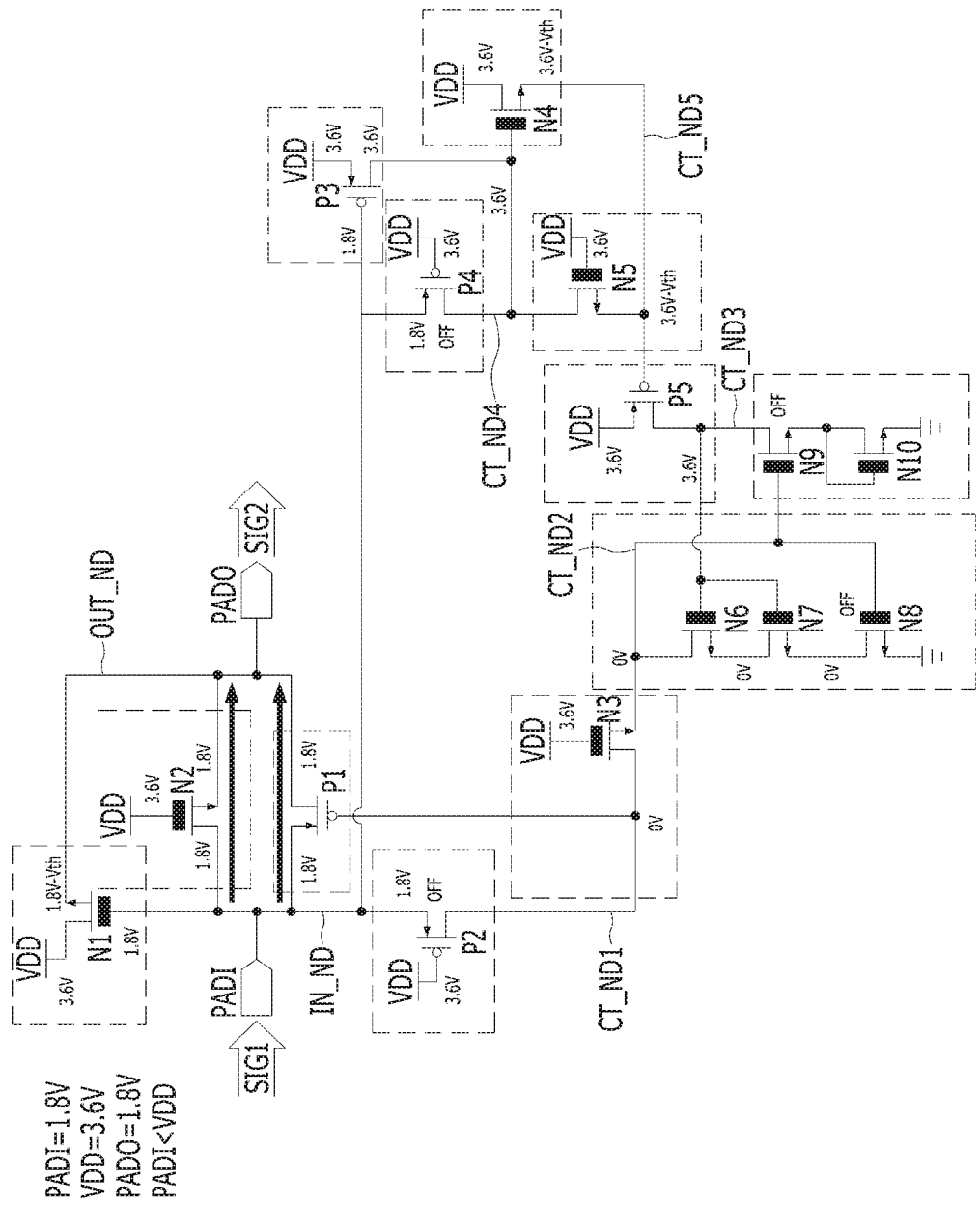

FIG. 5 is a diagram for describing a third operation of the signal transfer circuit 10 shown in FIG. 1.

Referring to FIG. 5, the first signal SIG1 having a voltage level of 1.8V is inputted to the signal transfer circuit 10 through the input pad PADI. Also, the signal transfer circuit 10 is supplied with the operating power source VDD of 3.6V. Therefore, in FIG. 5, the voltage level of the first signal SIG1 inputted to the signal transfer circuit 10 is lower than the voltage level of the operating power source VDD.

The second setting circuit 200 included in the signal transfer circuit 10 may detect the state in which the voltage level of the first signal SIG1 is lower than the voltage level of the operating power source VDD, and according to the detection result, may convert the first signal SIG1 inputted through the input pad PADI into the second signal SIG2 and transmit the second signal SIG2 to the output pad PADO. Here, the second signal SIG2 may have a voltage level of 1.8V. That is, the voltage level of the second signal SIG2 may be the same as the voltage level of the first signal SIG1.

The first setting circuit 100 included in the signal transfer circuit 10 may, when the voltage level of the first signal SIG1 is lower than the voltage level of the operating power source VDD, enter the mode for not disturbing the operation of the second setting circuit 200.

In detail, if the first signal SIG1 having the voltage level of 1.8V is inputted through the input pad PADI, a voltage level of the input node IN_ND may be 1.8V.

The detection circuit 220 included in the second setting circuit 200 may, when the voltage level of the input node IN_ND is 1.8V, maintain a voltage level of the detection node CT_ND1 at 0V, thereby allowing the first switch 210 to maintain a turned-on state. Thus, the first switch 210 may transmit the voltage of 1.8V loaded on the input node IN_ND, to the output node OUT_ND, as it is. Namely, because the first PMOS transistor P1 included in the first switch 210 is turned on when the voltage level of 0V loaded on the detection node CT_ND1 is inputted to the gate terminal thereof, the first PMOS transistor P1 may transmit the voltage of 1.8V loaded on the input node IN_ND coupled to the source terminal thereof, to the output node OUT_ND coupled to the drain terminal thereof, as it is. Therefore, a voltage level of the output node OUT_ND may become 1.8V as the voltage level of the first signal SIG1, and may be outputted as the second signal SIG2 through the output pad PADO.

The second switch 230 included in the second setting circuit 200 may, when the operating power source VDD is 3.6V, transmit the voltage of 1.8V loaded on the input node IN_ND, to the output node OUT_ND, as it is. Namely, the second NMOS transistor N2 included in the second switch 230 may, in response to the operating power source VDD of 3.6V inputted to the gate terminal thereof, transmit the voltage of 1.8V loaded on the input node IN_ND coupled with the drain terminal thereof, to the output node OUT_ND coupled with the source terminal thereof, as it is. In this way, because a voltage transmitted from the input node IN_ND to the output node OUT_ND through the operation of the second switch 230 is 1.8V, the operation of the second switch 230 may be the same as the operation of the first switch 210. Namely, the second switch 230 may assist the operation of the first switch 210 by coupling the input node IN_ND and the output node OUT_ND when it is detected that the first voltage level is lower than the second voltage level.

The first setting circuit 100 may, when the voltage level of the input node IN_ND is 1.8V, transmit a voltage having a magnitude of 1.8V-Vth lower than 1.8V in the operating power source VDD of 3.6V, to the output node OUT_ND. In other words, the first NMOS transistor N1 included in the first setting circuit 100 may, when the voltage of 1.8V loaded on the input node IN_ND is inputted to the gate terminal thereof, transmit the voltage having the magnitude of 1.8V-Vth lower than 1.8V in the operating power source VDD of 3.6V inputted to the drain terminal thereof, to the output node OUT_ND coupled with the source terminal thereof. Because a voltage transmitted from the input node IN_ND to the output node OUT_ND through the operation of the first setting circuit 100 has the magnitude of 1.8V-Vth lower than 1.8V, the operation of the first setting circuit 100 may not disturb the operation of the second setting circuit 200.

In detail, the operation of the detection circuit 220 included in the second setting circuit 200 will be described hereunder.

First, the second PMOS transistor P2 may be turned off because the operating power source VDD of 3.6V inputted to the gate terminal thereof is higher than the voltage of 1.8V loaded on the input node IN_ND coupled with the source terminal thereof. Therefore, through the second PMOS transistor P2, the voltage of 1.8V loaded on the input node IN_ND coupled to the source terminal thereof cannot be transmitted to the detection node CT_ND1 coupled with the drain terminal thereof. Hence, in a state in which only the operation of the second PMOS transistor P2 is performed, the detection node CT_ND1 may be in a floating state in which a voltage level thereof cannot be specified. However, from the fact that the voltage level of the first signal SIG1 is 1.8V, the first signal SIG1 swings between 0V and 1.8V. Because the second PMOS transistor P2 receives the operating power source VDD of 3.6V through the gate terminal thereof, the second PMOS transistor P2 always maintains a turned-off state regardless of the fact that the first signal SIG1 swings between 0V and 1.8V. Hence, in a state in which only the operation of the second PMOS transistor P2 is performed, the detection node CT_ND1 may be in a floating state close to 0V as the level of the ground voltage VSS.

Also, even though the third NMOS transistor N3 receives the operating power source VDD of 3.6V through the gate terminal thereof, since the detection node CT_ND1 coupled with the drain terminal thereof is in the floating state close to 0V as the level of the ground voltage VSS, the first sinking node CT_ND2 coupled to the source terminal thereof may also be in a floating state close to 0V as the level of the ground voltage VSS.

The fourth PMOS transistor P4 may be turned off because the operating power source VDD of 3.6V inputted to the gate terminal thereof is higher than the voltage of 1.8V loaded on the input node IN_ND coupled with the source terminal thereof. Therefore, through the fourth PMOS transistor P4, the voltage of 1.8V loaded on the input node IN_ND coupled to the source terminal thereof cannot be transmitted to the first intermediate node CT_ND4 coupled with the drain terminal thereof.

The third PMOS transistor P3 may, when the voltage of 1.8V loaded on the input node IN_ND is inputted to the gate terminal thereof, transmit the operating power source VDD of 3.6V inputted to the source terminal thereof, to the first intermediate node CT_ND4 coupled with the drain terminal thereof, as it is. Therefore, through the third PMOS transistor P3, the operating power source VDD of 3.6V inputted to the source terminal thereof may be transmitted to the first intermediate node CT_ND4, as it is.

By the operations of the third PMOS transistor P3 and the fourth PMOS transistor P4, the first intermediate node CT_ND4 may be determined to a state in which it has a voltage level of 3.6V.

The fourth NMOS transistor N4 may, when the voltage of 3.6V loaded on the first intermediate node CT_ND4 is inputted to the gate terminal thereof, transmit a voltage having a magnitude of 3.6V-Vth lower than 3.6V in the operating power source VDD of 3.6V inputted to the drain terminal thereof, to the second intermediate node CT_ND5 coupled with the source terminal thereof.

The fifth NMOS transistor N5 may, in response to the operating power source VDD of 3.6V inputted to the gate terminal thereof, transmit a voltage having a magnitude of 3.6V-Vth lower than 3.6V in the voltage of 3.6V loaded on the first intermediate node CT_ND4 coupled with the drain terminal thereof, to the second intermediate node CT_ND5 coupled with the source terminal thereof.

Through the operations of the fourth NMOS transistor N4 and the fifth NMOS transistor N5, the second intermediate node CT_ND5 may be determined to a voltage level having a magnitude of 3.6V-Vth lower than 3.6V.

The fifth PMOS transistor P5 may, when the voltage having the magnitude of 3.6V-Vth lower than 3.6V loaded on the second intermediate node CT_ND5 is inputted to the gate terminal thereof, transmit the operating power source VDD of 3.6V inputted to the source terminal thereof, to the second sinking node CT_ND3, as it is.

The ninth NMOS transistor N9 is turned off when the voltage close to 0V as the level of the ground voltage VSS loaded on the first sinking node CT_ND2 is inputted to the gate terminal thereof, and therefore, may not couple the second sinking node CT_ND3 coupled to the drain terminal thereof, with the gate terminal and the drain terminal of the tenth NMOS transistor N10 coupled to the source terminal thereof. Thus, even in a state in which a voltage of the second sinking node CT_ND3 is sufficiently high, it is possible to prevent the occurrence of leakage current.

Although the terminal of the ground voltage VSS is coupled to the source terminal of the tenth NMOS transistor N10, because the ninth NMOS transistor N9 is turned off, the second sinking node CT_ND3 may be determined to a state in which it has a voltage level of 3.6V, through the operations of the fifth PMOS transistor P5, the ninth NMOS transistor N9 and the tenth NMOS transistor N10.

The sixth NMOS transistor N6 may be turned on when the voltage of 3.6V loaded on the second sinking node CT_ND3 is inputted to the gate terminal thereof. The seventh NMOS transistor N7 may also be turned on when the voltage of 3.6V loaded on the second sinking node CT_ND3 is inputted to the gate terminal thereof. The eighth NMOS transistor N8 is turned off when the voltage close to 0V as the level of the ground voltage VSS loaded on the first sinking node CT_ND2 is inputted to the gate terminal thereof, and therefore, may not couple the source terminal of the seventh NMOS transistor N7 with the ground voltage VSS. Therefore, the first sinking node CT_ND2 which is in the floating state close to 0V due to the operations of the second PMOS transistor P2 and the third NMOS transistor N3 may be surely determined to 0V through the operations of the sixth NMOS transistor N6, the seventh NMOS transistor N7 and the eighth NMOS transistor N8.

By the above-described operations of the third NMOS transistor N3, the sixth NMOS transistor N6, the seventh NMOS transistor N7 and the eighth NMOS transistor N8, the detection node CT_ND1 may be surely determined to 0V.

Figure 6:
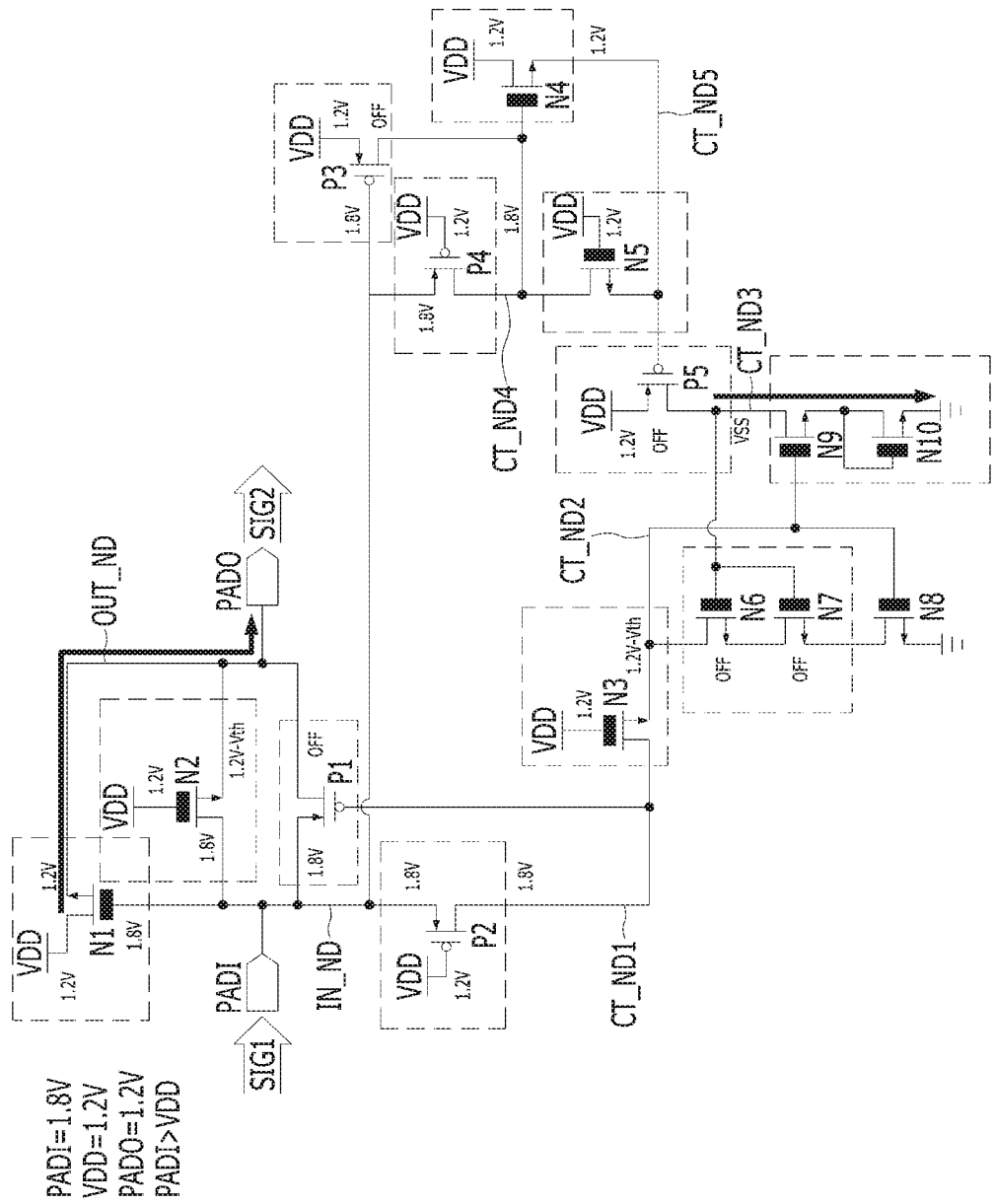

FIG. 6 is a diagram for describing a fourth operation of the signal transfer circuit 10 shown in FIG. 1.

Referring to FIG. 6, the first signal SIG1 having a voltage level of 1.8V is inputted to the signal transfer circuit 10 through the input pad PADI. Also, the signal transfer circuit 10 is supplied with the operating power source VDD of 1.2V. Therefore, in FIG. 6, the voltage level of the first signal SIG1 inputted to the signal transfer circuit 10 is higher than the voltage level of the operating power source VDD.

The first setting circuit 100 included in the signal transfer circuit 10 may, when the voltage level of the first signal SIG1 is higher than the voltage level of the operating power source VDD, convert the first signal SIG1 inputted through the input pad PADI into the second signal SIG2, and transmit the second signal SIG2 to the output pad PADO. Here, the second signal SIG2 may have a voltage level of 1.2V. That is, the voltage level of the second signal SIG2 may be the same as the voltage level of the operating power source VDD supplied to the signal transfer circuit 10.

The second setting circuit 200 included in the signal transfer circuit 10 may, by detecting the state in which the voltage level of the first signal SIG1 is higher than the voltage level of the operating power source VDD, enter the mode for not disturbing the operation of the first setting circuit 100.

In detail, when the first signal SIG1 having the voltage level of 1.8V is inputted through the input pad PADI, a voltage level of the input node IN_ND may be 1.8V.

The first setting circuit 100 may, when the voltage level of the input node IN_ND is 1.8V, transmit the operating power source VDD of 1.2V to the output node OUT_ND, as it is. In other words, the first NMOS transistor N1 included in the first setting circuit 100 may, when the voltage of 1.8V loaded on the input node IN_ND is inputted to the gate terminal thereof, transmit the operating power source VDD of 1.2V inputted to the drain terminal thereof, to the output node OUT_ND coupled with the source terminal thereof, as it is. Therefore, a voltage level of the output node OUT_ND may become 1.2V as the voltage level of the operating power source VDD, and may be outputted as the second signal SIG2 through the output pad PADO.

The second switch 230 included in the second setting circuit 200 may, when the operating power source VDD is 1.2V, transmit a voltage having a magnitude of 1.2V-Vth lower than 1.2V in the voltage of 1.8V loaded on the input node IN_ND, to the output node OUT_ND. Namely, the second NMOS transistor N2 included in the second switch 230 may, in response to the operating power source VDD of 1.2V inputted to the gate terminal thereof, transmit the voltage having the magnitude of 1.2V-Vth lower than 1.2V in the voltage of 1.8V loaded on the input node IN_ND coupled with the drain terminal thereof, to the output node OUT_ND coupled with the source terminal thereof. Because a voltage transmitted from the input node IN_ND to the output node OUT_ND through the operation of the second switch 230 has the magnitude of 1.2V-Vth lower than 1.2V, the operation of the second switch 230 may not disturb the operation of the first setting circuit 100.

The detection circuit 220 included in the second setting circuit 200 may, when the voltage level of the input node IN_ND is 1.8V, maintain a voltage level of the detection node CT_ND1 at 1.8V, thereby allowing the first switch 210 to maintain a turned-off state. Thus, the first switch 210 does not transmit the voltage of 1.8V loaded on the input node IN_ND, to the output node OUT_ND. Namely, because the first PMOS transistor P1 included in the first switch 210 is turned off when the voltage level of 1.8V loaded on the detection node CT_ND1 is inputted to the gate terminal thereof, the first PMOS transistor P1 cannot transmit the voltage of 1.8V loaded on the input node IN_ND coupled to the source terminal thereof, to the output node OUT_ND coupled to the drain terminal thereof. In this way, because the first switch 210 is turned off, the operation of the first switch 210 may not disturb the operation of the first setting circuit 100. As described above, because the operations of the first switch 210 and the second switch 230 included in the second setting circuit 200 do not disturb the operation of the first setting circuit 100, the operation of the second setting circuit 200 does not disturb the operation of the first setting circuit 100.

In detail, the operation of the detection circuit 220 included in the second setting circuit 200 will be described hereunder.

First, the second PMOS transistor P2 may, in response to the operating power source VDD of 1.2V inputted to the gate terminal thereof, transmit the voltage of 1.8V loaded on the input node IN_ND coupled with the source terminal thereof, to the detection node CT_ND1 coupled with the drain terminal thereof, as it is.

The third NMOS transistor N3 may, in response to the operating power source VDD of 1.2V inputted to the gate terminal thereof, transmit a voltage having a magnitude of 1.2V-Vth lower than 1.2V in the voltage of 1.8V loaded on the detection node CT_ND1 coupled with the drain terminal thereof, to the first sinking node CT_ND2 coupled with the source terminal thereof.

The fourth PMOS transistor P4 may, in response to the operating power source VDD of 1.2V inputted to the gate terminal thereof, transmit the voltage of 1.8V loaded on the input node IN_ND coupled with the source terminal thereof, to the first intermediate node CT_ND4 coupled with the drain terminal thereof, as it is.

The third PMOS transistor P3 is turned off when the voltage of 1.8V loaded on the input node IN_ND is inputted to the gate terminal thereof, and therefore, cannot transmit the operating power source VDD of 1.2V inputted to the source terminal thereof, to the first intermediate node CT_ND4.

By the operations of the third PMOS transistor P3 and the fourth PMOS transistor P4, the first intermediate node CT_ND4 may be determined to a state in which it has a voltage level of 1.8V.

The fourth NMOS transistor N4 may, when the voltage of 1.8V loaded on the first intermediate node CT_ND4 is inputted to the gate terminal thereof, transmit the operating power source VDD of 1.2V inputted to the drain terminal thereof, to the second intermediate node CT_ND5 coupled with the source terminal thereof, as it is.

The fifth NMOS transistor N5 may, in response to the operating power source VDD of 1.2V inputted to the gate terminal thereof, transmit a voltage having a magnitude of 1.2V-Vth lower than 1.2V in the voltage of 1.8V loaded on the first intermediate node CT_ND4 coupled with the drain terminal thereof, to the second intermediate node CT_ND5 coupled with the source terminal thereof.

Because a voltage transmitted from the first intermediate node CT_ND4 to the second intermediate node CT_ND5 through the operation of the fifth NMOS transistor N5 has the magnitude 1.2V-Vth lower than 1.2V and a voltage transmitted from the first intermediate node CT_ND4 to the second intermediate node CT_ND5 through the operation of the fourth NMOS transistor N4 is 1.2V, the second intermediate node CT_ND5 may be determined to a state in which it has a voltage level of 1.2V.

The fifth PMOS transistor P5 is turned off when the voltage of 1.2V loaded on the second intermediate node CT_ND5 is inputted to the gate terminal thereof, and therefore, cannot transmit the operating power source VDD of 1.2V inputted to the source terminal thereof, to the second sinking node CT_ND3.

The ninth NMOS transistor N9 is turned on when the voltage having the magnitude of 1.2V-Vth lower than 1.2V loaded on the first sinking node CT_ND2 is inputted to the gate terminal thereof, and therefore, may couple the second sinking node CT_ND3 coupled to the drain terminal thereof, with the gate terminal and the drain terminal of the tenth NMOS transistor N10 coupled to the source terminal thereof.

Because the terminal of the ground voltage VSS is coupled to the source terminal of the tenth NMOS transistor N10, the second sinking node CT_ND3 may be determined to a state in which it has the level of the ground voltage VSS, through the operations of the ninth NMOS transistor N9 and the tenth NMOS transistor N10.

The sixth NMOS transistor N6 may be turned off when the ground voltage VSS loaded on the second sinking node CT_ND3 is inputted to the gate terminal thereof. The seventh NMOS transistor N7 may also be turned off when the ground voltage VSS loaded on the second sinking node CT_ND3 is inputted to the gate terminal thereof. Thus, even though the eighth NMOS transistor N8 is turned on when the voltage having the magnitude of 1.2V-Vth lower than 1.2V loaded on the first sinking node CT_ND2 is inputted to the gate terminal thereof, the first sinking node CT_ND2 may be determined to a state in which it has the voltage having the magnitude of 1.2V-Vth lower than 1.2V determined by the third NMOS transistor N3.

By the above-described operations of the third NMOS transistor N3, the sixth NMOS transistor N6, the seventh NMOS transistor N7 and the eighth NMOS transistor N8, the detection node CT_ND1 may be determined to a state in which it has the voltage of 1.8V determined by the second PMOS transistor P2.

Figure 7:
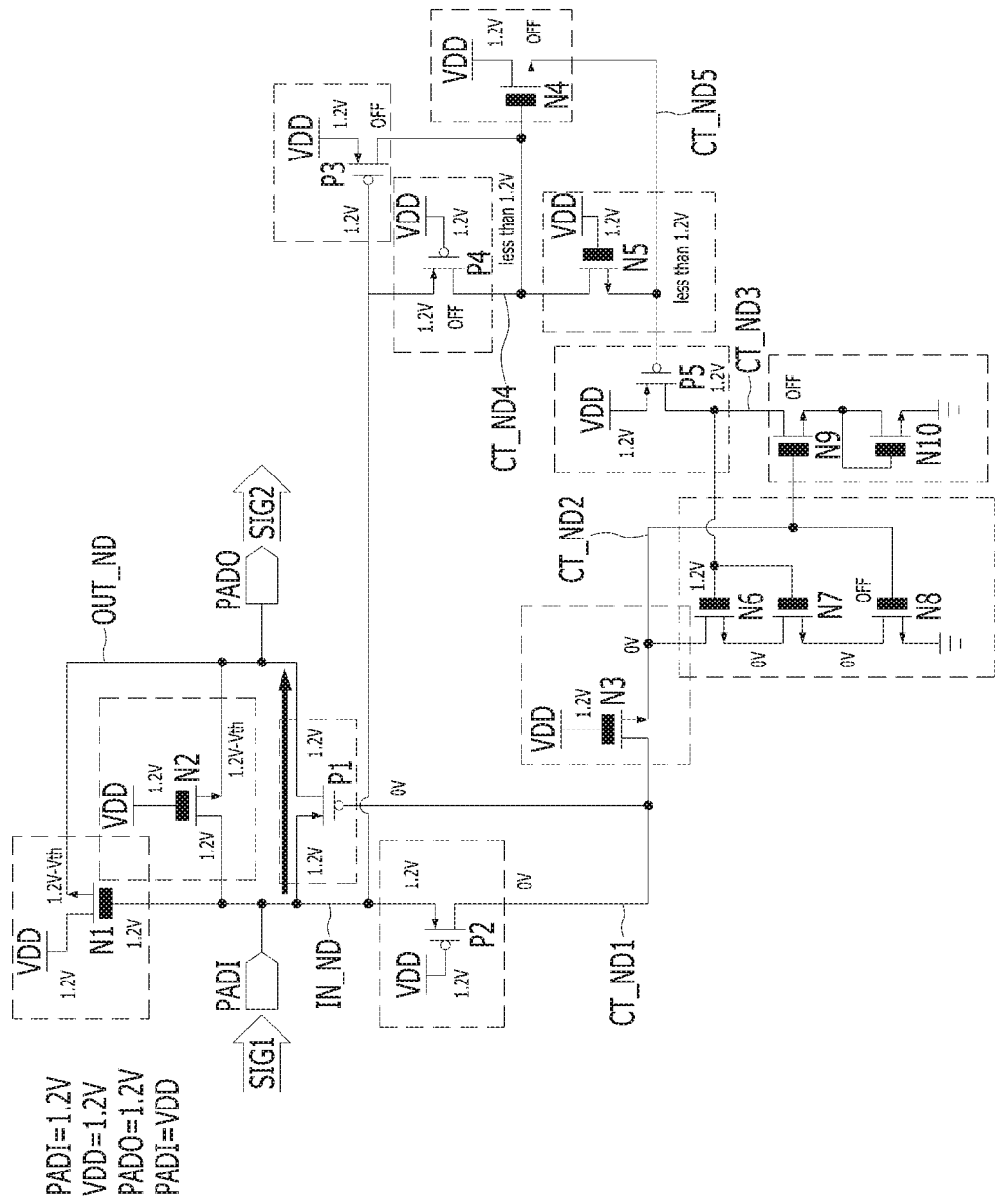

FIG. 7 is a diagram for describing a fifth operation of the signal transfer circuit 10 shown in FIG. 1.

Referring to FIG. 7, the first signal SIG1 having a voltage level of 1.2V is inputted to the signal transfer circuit 10 through the input pad PADI. Also, the signal transfer circuit 10 is supplied with the operating power source VDD of 1.2V. Therefore, in FIG. 7, the voltage level of the first signal SIG1 inputted to the signal transfer circuit 10 is equal to the voltage level of the operating power source VDD.

The second setting circuit 200 included in the signal transfer circuit 10 may detect the state in which the voltage level of the first signal SIG1 is equal to the voltage level of the operating power source VDD, and according to the detection result, may convert the first signal SIG1 inputted through the input pad PADI into the second signal SIG2 and transmit the second signal SIG2 to the output pad PADO. Here, the second signal SIG2 may have a voltage level of 1.2V. That is, the voltage level of the second signal SIG2 may be the same as the voltage level of the first signal SIG1.

The first setting circuit 100 included in the signal transfer circuit 10 may, when the voltage level of the first signal SIG1 is equal to the voltage level of the operating power source VDD, enter the mode for not disturbing the operation of the second setting circuit 200.

In detail, if the first signal SIG1 having the voltage level of 1.2V is inputted through the input pad PADI, a voltage level of the input node IN_ND may be 1.2V.

The detection circuit 220 included in the second setting circuit 200 may, when the voltage level of the input node IN_ND is 1.2V, maintain a voltage level of the detection node CT_ND1 at 0V, thereby allowing the first switch 210 to maintain a turned-on state. Thus, the first switch 210 may transmit the voltage of 1.2V loaded on the input node IN_ND, to the output node OUT_ND, as it is. Namely, because the first PMOS transistor P1 included in the first switch 210 is turned on when the voltage level of 0V loaded on the detection node CT_ND1 is inputted to the gate terminal thereof, the first PMOS transistor P1 may transmit the voltage of 1.2V loaded on the input node IN_ND coupled to the source terminal thereof, to the output node OUT_ND coupled to the drain terminal thereof, as it is. Therefore, a voltage level of the output node OUT_ND may become 1.2V as the voltage level of the first signal SIG1, and may be outputted as the second signal SIG2 through the output pad PADO.

The second switch 230 included in the second setting circuit 200 may, when the operating power source VDD is 1.2V, transmit a voltage having a magnitude of 1.2V-Vth lower than 1.2V in the voltage of 1.2V loaded on the input node IN_ND, to the output node OUT_ND. Namely, the second NMOS transistor N2 included in the second switch 230 may, in response to the operating power source VDD of 1.2V inputted to the gate terminal thereof, transmit the voltage having the magnitude of 1.2V-Vth lower than 1.2V in the voltage of 1.2V loaded on the input node IN_ND coupled with the drain terminal thereof, to the output node OUT_ND coupled with the source terminal thereof. Because a voltage transmitted from the input node IN_ND to the output node OUT_ND through the operation of the second switch 230 has the magnitude of 1.2V-Vth lower than 1.2V, the operation of the second switch 230 may not disturb the operation of the first switch 210.

The first setting circuit 100 may, when the voltage level of the input node IN_ND is 1.2V, transmit a voltage having a magnitude of 1.2V-Vth lower than 1.2V in the operating power source VDD of 1.2V, to the output node OUT_ND. In other words, the first NMOS transistor N1 included in the first setting circuit 100 may, when the voltage of 1.2V loaded on the input node IN_ND is inputted to the gate terminal thereof, transmit the voltage having the magnitude of 1.2V-Vth lower than 1.2V in the operating power source VDD of 1.2V inputted to the drain terminal thereof, to the output node OUT_ND coupled with the source terminal thereof. Because a voltage transmitted from the input node IN_ND to the output node OUT_ND through the operation of the first setting circuit 100 has the magnitude of 1.2V-Vth lower than 1.2V, the operation of the first setting circuit 100 may not disturb the operation of the second setting circuit 200.

In detail, the operation of the detection circuit 220 included in the second setting circuit 200 will be described hereunder.

First, the second PMOS transistor P2 may be turned off because the operating power source VDD of 1.2V inputted to the gate terminal thereof and the voltage of 1.2V loaded on the input node IN_ND coupled with the source terminal thereof are the same with each other. Therefore, through the second PMOS transistor P2, the voltage of 1.2V loaded on the input node IN_ND coupled to the source terminal thereof cannot be transmitted to the detection node CT_ND1 coupled with the drain terminal thereof. Hence, in a state in which only the operation of the second PMOS transistor P2 is performed, the detection node CT_ND1 may be in a floating state in which a voltage level thereof cannot be specified. However, from the fact that the voltage level of the first signal SIG1 is 1.2V, the first signal SIG1 swings between 0V and 1.2V. Because the second PMOS transistor P2 receives the operating power source VDD of 1.2V through the gate terminal thereof, the second PMOS transistor P2 always maintains a turned-off state regardless of the fact that the first signal SIG1 swings between 0V and 1.2V. Hence, in a state in which only the operation of the second PMOS transistor P2 is performed, the detection node CT_ND1 may be in a floating state close to 0V as the level of the ground voltage VSS.

Also, even though the third NMOS transistor N3 receives the operating power source VDD of 1.2V through the gate terminal thereof, since the detection node CT_ND1 coupled with the drain terminal thereof is in the floating state close to 0V as the level of the ground voltage VSS, the first sinking node CT_ND2 coupled to the source terminal thereof may also be in a floating state close to 0V as the level of the ground voltage VSS.

Further, the fourth PMOS transistor P4 may be turned off because the operating power source VDD of 1.2V inputted to the gate terminal thereof and the voltage of 1.2V loaded on the input node IN_ND coupled with the source terminal thereof are the same with each other. Therefore, through the fourth PMOS transistor P4, the voltage of 1.2V loaded on the input node IN_ND coupled to the source terminal thereof cannot be transmitted to the first intermediate node CT_ND4 coupled with the drain terminal thereof.

The third PMOS transistor P3 may be turned off because the voltage of 1.2V loaded on the input node IN_ND and inputted to the gate terminal thereof and the operating power source VDD of 1.2V inputted to the source terminal thereof are the same with each other. Therefore, through the third PMOS transistor P3, the operating power source VDD of 1.2V inputted to the source terminal thereof cannot be transmitted to the first intermediate node CT_ND4. Hence, in a state in which only the operations of the third PMOS transistor P3 and the fourth PMOS transistor P4 are performed, the first intermediate node CT_ND4 may be in a floating state in which a voltage level thereof cannot be specified. However, from the fact that the voltage level of the first signal SIG1 is 1.2V, the first signal SIG1 swings between 0V and 1.2V. Because the third PMOS transistor P3 receives the voltage of 1.2V loaded on the input node IN_ND, through the gate terminal thereof, the third PMOS transistor P3 may be switched between a turned-on state and a turned-off state when the first signal SIG1 swings between 0V and 1.2V. Hence, in a state in which only the operations of the third PMOS transistor P3 and the fourth PMOS transistor P4 are performed, the first intermediate node CT_ND4 may be in a floating state in which it has a voltage level lower than 1.2V.

In other words, due to the operations of the third PMOS transistor P3 and the fourth PMOS transistor P4, the first intermediate node CT_ND4 may be determined to a floating state in which it has a voltage level lower than 1.2V.

The fourth NMOS transistor N4 may be turned off when the voltage having the voltage level lower than 1.2V loaded on the first intermediate node CT_ND4 is inputted to the gate terminal thereof. Namely, through the fourth NMOS transistor N4, the operating power source VDD of 1.2V inputted to the drain terminal thereof cannot be transmitted to the second intermediate node CT_ND5 coupled with the source terminal thereof.

The fifth NMOS transistor N5 may, in response to the operating power source VDD of 1.2V inputted to the gate terminal thereof, transmit the voltage having the voltage level lower than 1.2V loaded on the first intermediate node CT_ND4 coupled with the drain terminal thereof, to the second intermediate node CT_ND5 coupled with the source terminal thereof, as it is.

Through the operations of the fourth NMOS transistor N4 and the fifth NMOS transistor N5, the second intermediate node CT_ND5 may be determined to a floating state in which it has a voltage level lower than 1.2V.

The fifth PMOS transistor P5 may, when the voltage having the voltage level lower than 1.2V loaded on the second intermediate node CT_ND5 is inputted to the gate terminal thereof, transmit the operating power source VDD of 1.2V inputted to the source terminal thereof, to the second sinking node CT_ND3, as it is.

The ninth NMOS transistor N9 is turned off when the voltage close to 0V as the level of the ground voltage VSS loaded on the first sinking node CT_ND2 is inputted to the gate terminal thereof, and therefore, may not couple the second sinking node CT_ND3 coupled to the drain terminal thereof, with the gate terminal and the drain terminal of the tenth NMOS transistor N10 coupled to the source terminal thereof. Thus, even in a state in which a voltage of the second sinking node CT_ND3 is sufficiently high, it is possible to prevent the occurrence of leakage current.

Although the terminal of the ground voltage VSS is coupled to the source terminal of the tenth NMOS transistor N10, because the ninth NMOS transistor N9 is turned off, the second sinking node CT_ND3 may be determined to a state in which it has a voltage level of 1.2V, through the operations of the fifth PMOS transistor P5, the ninth NMOS transistor N9 and the tenth NMOS transistor N10.

The sixth NMOS transistor N6 may be turned on when the voltage of 1.2V loaded on the second sinking node CT_ND3 is inputted to the gate terminal thereof. The seventh NMOS transistor N7 may also be turned on when the voltage of 1.2V loaded on the second sinking node CT_ND3 is inputted to the gate terminal thereof. The eighth NMOS transistor N8 is turned off when the voltage close to 0V as the level of the ground voltage VSS loaded on the first sinking node CT_ND2 is inputted to the gate terminal thereof, and therefore, may not couple the source terminal of the seventh NMOS transistor N7 with the ground voltage VSS. Therefore, the first sinking node CT_ND2 which is in the floating state close to 0V due to the operations of the second PMOS transistor P2 and the third NMOS transistor N3 may be determined to be 0V through the operations of the sixth NMOS transistor N6, the seventh NMOS transistor N7 and the eighth NMOS transistor N8.

By the above-described operations of the third NMOS transistor N3, the sixth NMOS transistor N6, the seventh NMOS transistor N7 and the eighth NMOS transistor N8, the detection node CT_ND1 may be determined to be 0V.

Figure 8:
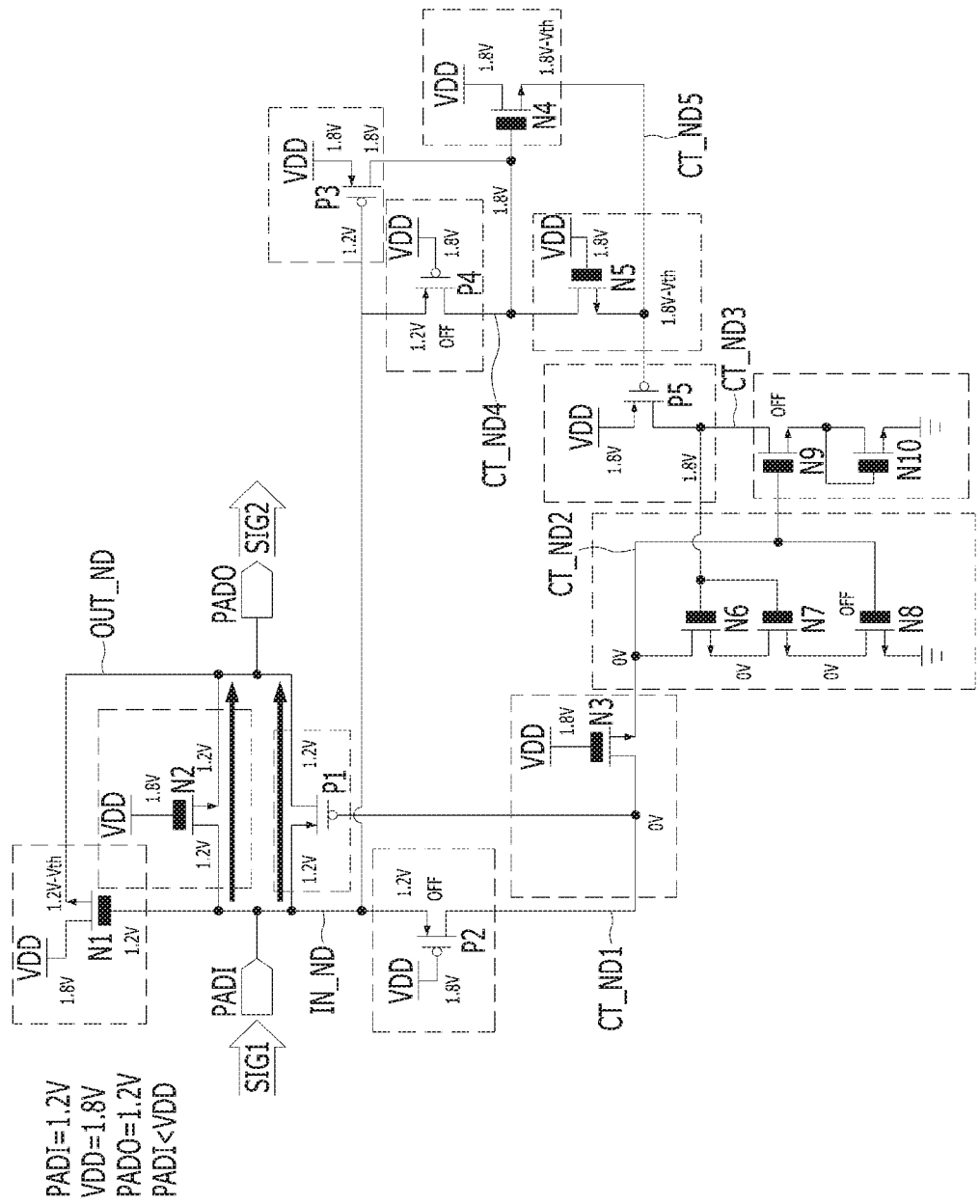

FIG. 8 is a diagram for describing a sixth operation of the signal transfer circuit 10 shown in FIG. 1.

Referring to FIG. 8, the first signal SIG1 having a voltage level of 1.2V is inputted to the signal transfer circuit 10 through the input pad PADI. Also, the signal transfer circuit 10 is supplied with the operating power source VDD of 1.8V. Therefore, in FIG. 8, the voltage level of the first signal SIG1 inputted to the signal transfer circuit 10 is lower than the voltage level of the operating power source VDD.

The second setting circuit 200 included in the signal transfer circuit 10 may detect the state in which the voltage level of the first signal SIG1 is lower than the voltage level of the operating power source VDD, and according to the detection result, may convert the first signal SIG1 inputted through the input pad PADI into the second signal SIG2 and transmit the second signal SIG2 to the output pad PADO. Here, the second signal SIG2 may have a voltage level of 1.2V. That is, the voltage level of the second signal SIG2 may be the same as the voltage level of the first signal SIG1.

The first setting circuit 100 included in the signal transfer circuit 10 may, when the voltage level of the first signal SIG1 is equal to the voltage level of the operating power source VDD, enter the mode for not disturbing the operation of the second setting circuit 200.

In detail, if the first signal SIG1 having the voltage level of 1.2V is inputted through the input pad PADI, a voltage level of the input node IN_ND may be 1.2V.

The detection circuit 220 included in the second setting circuit 200 may, when the voltage level of the input node IN_ND is 1.2V, maintain a voltage level of the detection node CT_ND1 at 0V, thereby allowing the first switch 210 to maintain a turned-on state. Thus, the first switch 210 may transmit the voltage of 1.2V loaded on the input node IN_ND, to the output node OUT_ND, as it is. Namely, because the first PMOS transistor P1 included in the first switch 210 is turned on when the voltage level of 0V loaded on the detection node CT_ND1 is inputted to the gate terminal thereof, the first PMOS transistor P1 may transmit the voltage of 1.2V loaded on the input node IN_ND coupled to the source terminal thereof, to the output node OUT_ND coupled to the drain terminal thereof, as it is. Therefore, a voltage level of the output node OUT_ND may become 1.2V as the voltage level of the first signal SIG1, and may be outputted as the second signal SIG2 through the output pad PADO.

The second switch 230 included in the second setting circuit 200 may, when the operating power source VDD is 1.8V, transmit the voltage of 1.2V loaded on the input node IN_ND, to the output node OUT_ND, as it is. Namely, the second NMOS transistor N2 included in the second switch 230 may, in response to the operating power source VDD of 1.8V inputted to the gate terminal thereof, transmit the voltage of 1.2V loaded on the input node IN_ND coupled with the drain terminal thereof, to the output node OUT_ND coupled with the source terminal thereof, as it is. In this way, because a voltage transmitted from the input node IN_ND to the output node OUT_ND through the operation of the second switch 230 is 1.2V, the operation of the second switch 230 may be the same as the operation of the first switch 210. Namely, the second switch 230 may assist the operation of the first switch 210 by coupling the input node IN_ND and the output node OUT_ND when it is detected that the first voltage level is lower than the second voltage level.

The first setting circuit 100 may, when the voltage level of the input node IN_ND is 1.2V, transmit a voltage having a magnitude of 1.2V-Vth lower than 1.2V in the operating power source VDD of 1.8V, to the output node OUT_ND. In other words, the first NMOS transistor N1 included in the first setting circuit 100 may, when the voltage of 1.2V loaded on the input node IN_ND is inputted to the gate terminal thereof, transmit the voltage having the magnitude of 1.2V-Vth lower than 1.2V in the operating power source VDD of 1.8V inputted to the drain terminal thereof, to the output node OUT_ND coupled with the source terminal thereof. Because a voltage transmitted from the input node IN_ND to the output node OUT_ND through the operation of the first setting circuit 100 has the magnitude of 1.2V-Vth lower than 1.2V, the operation of the first setting circuit 100 may not disturb the operation of the second setting circuit 200.

In detail, the operation of the detection circuit 220 included in the second setting circuit 200 will be described hereunder.

First, the second PMOS transistor P2 may be turned off because the operating power source VDD of 1.8V inputted to the gate terminal thereof is higher than the voltage of 1.2V loaded on the input node IN_ND coupled with the source terminal thereof. Therefore, through the second PMOS transistor P2, the voltage of 1.2V loaded on the input node IN_ND coupled to the source terminal thereof cannot be transmitted to the detection node CT_ND1 coupled with the drain terminal thereof. Hence, in a state in which only the operation of the second PMOS transistor P2 is performed, the detection node CT_ND1 may be in a floating state in which a voltage level thereof cannot be specified. However, from the fact that the voltage level of the first signal SIG1 is 1.2V, the first signal SIG1 swings between 0V and 1.2V. Because the second PMOS transistor P2 receives the operating power source VDD of 1.8V through the gate terminal thereof, the second PMOS transistor P2 always maintains a turned-off state regardless of the fact that the first signal SIG1 swings between 0V and 1.2V. Hence, in a state in which only the operation of the second PMOS transistor P2 is performed, the detection node CT_ND1 may be in a floating state close to 0V as the level of the ground voltage VSS.

Also, even though the third NMOS transistor N3 receives the operating power source VDD of 1.8V through the gate terminal thereof, since the detection node CT_ND1 coupled with the drain terminal thereof is in the floating state close to 0V as the level of the ground voltage VSS, the first sinking node CT_ND2 coupled to the source terminal thereof may also be in a floating state close to 0V as the level of the ground voltage VSS.

The fourth PMOS transistor P4 may be turned off because the operating power source VDD of 1.8V inputted to the gate terminal thereof is higher than the voltage of 1.2V loaded on the input node IN_ND coupled with the source terminal thereof. Therefore, through the fourth PMOS transistor P4, the voltage of 1.2V loaded on the input node IN_ND coupled to the source terminal thereof cannot be transmitted to the first intermediate node CT_ND4 coupled with the drain terminal thereof.

The third PMOS transistor P3 may, when the voltage of 1.2V loaded on the input node IN_ND is inputted to the gate terminal thereof, transmit the operating power source VDD of 1.8V inputted to the source terminal thereof, to the first intermediate node CT_ND4 coupled with the drain terminal thereof, as it is. Therefore, through the third PMOS transistor P3, the operating power source VDD of 1.8V inputted to the source terminal thereof may be transmitted to the first intermediate node CT_ND4, as it is.

By the operations of the third PMOS transistor P3 and the fourth PMOS transistor P4, the first intermediate node CT_ND4 may be determined to a state in which it has a voltage level of 1.8V.

The fourth NMOS transistor N4 may, when the voltage of 1.8V loaded on the first intermediate node CT_ND4 is inputted to the gate terminal thereof, transmit a voltage having a magnitude of 1.8V-Vth lower than 1.8V in the operating power source VDD of 1.8V inputted to the drain terminal thereof, to the second intermediate node CT_ND5 coupled with the source terminal thereof.

The fifth NMOS transistor N5 may, in response to the operating power source VDD of 1.8V inputted to the gate terminal thereof, transmit a voltage having a magnitude of 1.8V-Vth lower than 1.8V in the voltage of 1.8V loaded on the first intermediate node CT_ND4 coupled with the drain terminal thereof, to the second intermediate node CT_ND5 coupled with the source terminal thereof.

Through the operations of the fourth NMOS transistor N4 and the fifth NMOS transistor N5, the second intermediate node CT_ND5 may be determined to a voltage level having a magnitude of 1.8V-Vth lower than 1.8V.

The fifth PMOS transistor P5 may, when the voltage having the magnitude of 1.8V-Vth lower than 1.8V loaded on the second intermediate node CT_ND5 is inputted to the gate terminal thereof, transmit the operating power source VDD of 1.8V inputted to the source terminal thereof, to the second sinking node CT_ND3, as it is.

The ninth NMOS transistor N9 is turned off when the voltage close to 0V as the level of the ground voltage VSS loaded on the first sinking node CT_ND2 is inputted to the gate terminal thereof, and therefore, may not couple the second sinking node CT_ND3 coupled to the drain terminal thereof, with the gate terminal and the drain terminal of the tenth NMOS transistor N10 coupled to the source terminal thereof. Thus, even in a state in which a voltage of the second sinking node CT_ND3 is sufficiently high, it is possible to prevent the occurrence of leakage current.

Although the terminal of the ground voltage VSS is coupled to the source terminal of the tenth NMOS transistor N10, because the ninth NMOS transistor N9 is turned off, the second sinking node CT_ND3 may be determined to a state in which it has a voltage level of 1.8V, through the operations of the fifth PMOS transistor P5, the ninth NMOS transistor N9 and the tenth NMOS transistor N10.

The sixth NMOS transistor N6 may be turned on when the voltage of 1.8V loaded on the second sinking node CT_ND3 is inputted to the gate terminal thereof. The seventh NMOS transistor N7 may also be turned on when the voltage of 1.8V loaded on the second sinking node CT_ND3 is inputted to the gate terminal thereof. The eighth NMOS transistor N8 is turned off when the voltage close to 0V as the level of the ground voltage VSS loaded on the first sinking node CT_ND2 is inputted to the gate terminal thereof, and therefore, may not couple the source terminal of the seventh NMOS transistor N7 with the ground voltage VSS. Therefore, the first sinking node CT_ND2 which is in the floating state close to 0V due to the operations of the second PMOS transistor P2 and the third NMOS transistor N3 may be determined to be 0V through the operations of the sixth NMOS transistor N6, the seventh NMOS transistor N7 and the eighth NMOS transistor N8.

By the above-described operations of the third NMOS transistor N3, the sixth NMOS transistor N6, the seventh NMOS transistor N7 and the eighth NMOS transistor N8, the detection node CT_ND1 may be determined to be 0V.

As is apparent from the above descriptions, in the signal transfer circuit according to the embodiment of the disclosure, the difference between a voltage level of an operating power source and a voltage level of an input signal may be detected without using a separate control signal, and a path through which the input signal is transmitted may be multiplexed depending on a detection result, thereby allowing the input signal to be transmitted through a most stable path. Through this, the duty ratio of a signal outputted through the signal transfer circuit may be improved, and a noise margin may be secured. Also, the operational stability of a semiconductor device which performs an internal operation by using the signal outputted through the signal transfer circuit may be secured.

Although various embodiments have been described for illustrative purposes, it will be apparent to those skilled in the art that various changes and modifications may be made without departing from the spirit and scope of the invention as defined in the following claims.

For instance, positions and types of the logic gates and transistors described as an example in the above embodiment should be differently embodied according to the polarities of the signals inputted thereto.

What is claimed is:

1. A signal transfer circuit for receiving a first signal to transfer the received first signal as a second signal by using an operating power source having a second voltage level, the signal transfer circuit comprising:
   a first setting circuit; and
   a second setting circuit,
   wherein the first signal swings between a first voltage level and a ground level, and the second signal swings between a third voltage level and the ground level,
   wherein the first setting circuit is configured to set the third voltage level to be same as the second voltage level, when the first voltage level is higher than the second voltage level, and
   wherein the second setting circuit is configured to set the third voltage level to be same as the first voltage level, by detecting when the first voltage level is lower than or equal to the second voltage level.

2. The signal transfer circuit according to claim 1, wherein the first setting circuit enters a mode for not disturbing an operation of the second setting circuit, when the first voltage level is lower than or equal to the second voltage level.

3. The signal transfer circuit according to claim 2, wherein the second setting circuit enters a mode for not disturbing an operation of the first setting circuit, by detecting when the first voltage level is higher than the second voltage level.

4. The signal transfer circuit according to claim 3, wherein the second setting circuit comprises:
   a first switch suitable for being controlled in response to a voltage level of a detection node between an input node for receiving the first signal and an output node for outputting the second signal; and
   a detection circuit suitable for setting a voltage level of the detection node by detecting a difference between the first voltage level and the second voltage level.

5. The signal transfer circuit according to claim 4,
   wherein the detection circuit sets a voltage level of the detection node to a voltage level for turning on the first switch, by detecting when the first voltage level is lower than or equal to the second voltage level, and
   wherein the detection circuit sets a voltage level of the detection node to a voltage level for turning off the first switch, by detecting when the first voltage level is higher than the second voltage level.

6. The signal transfer circuit according to claim 5, wherein the second setting circuit further comprises:
   a second switch suitable for coupling the input node and the output node by detecting when the first voltage level is lower than the second voltage level.

7. The signal transfer circuit according to claim 6, wherein the first setting circuit comprises:
   a first NMOS transistor having a gate terminal which is coupled to the input node, a drain terminal to which the operating power source is supplied, and a source terminal which is coupled to the output node.

8. The signal transfer circuit according to claim 7, wherein the first switch comprises:
   a first PMOS transistor having a source terminal which is coupled to the input node, a gate terminal which is coupled to the detection node, and a drain terminal which is coupled to the output node.

9. The signal transfer circuit according to claim 8, wherein the second switch comprises:
   a second NMOS transistor having a drain terminal which is coupled to the input node, a gate terminal to which the operating power source is supplied, and a source terminal which is coupled to the output node.

10. The signal transfer circuit according to claim 9, wherein the detection circuit comprises:
    a second PMOS transistor having a source terminal which is coupled to the input node, a gate terminal to which the operating power source is supplied, and a drain terminal to which the detection node is coupled;
    a third PMOS transistor having a source terminal to which the operating power source is supplied, a gate terminal which is coupled to the input node, and a drain terminal to which a first intermediate node is coupled;
    a fourth PMOS transistor having a source terminal which is coupled to the input node, a gate terminal to which the operating power source is supplied, and a drain terminal to which the first intermediate node is coupled;
    a third NMOS transistor having a drain terminal to which the detection node is coupled, a gate terminal to which the operating power source is supplied, and a source terminal to which a first sinking node is coupled;
    a fourth NMOS transistor having a drain terminal to which the operating power source is supplied, a gate terminal which is coupled to the first intermediate node, and a source terminal to which a second intermediate node is coupled;
    a fifth NMOS transistor having a drain terminal to which the first intermediate node is coupled, a gate terminal to which the operating power source is supplied, and a source terminal to which the second intermediate node is coupled;
    a fifth PMOS transistor having a source terminal to which the operating power source is supplied, a gate terminal which is coupled to the second intermediate node, and a drain terminal to which a second sinking node is coupled;
    a sixth NMOS transistor having a drain terminal to which the first sinking node is coupled and a gate terminal to which the second sinking node is coupled;
    a seventh NMOS transistor having a drain terminal to which a source terminal of the sixth NMOS transistor is coupled and a gate terminal to which the second sinking node is coupled;
    an eighth NMOS transistor having a drain terminal to which a source terminal of the seventh NMOS transistor is coupled, a gate terminal to which the first sinking node is coupled, and a source terminal to which a ground is coupled;
    a ninth NMOS transistor having a drain terminal to which the second sinking node is coupled and a gate terminal to which the first sinking node is coupled; and
    a tenth NMOS transistor having a drain terminal and a gate terminal to which a source terminal of the ninth NMOS transistor is coupled in common, and a source terminal which is coupled to the ground.

11. A semiconductor device comprising:
    a first integrated circuit configured to use a first operating power source having a first voltage level, and output a first signal swinging between the first voltage level and a ground level; and
    a second integrated circuit including a signal transfer circuit, and configured to perform a predetermined internal operation using a second operating power source having a second voltage level,
    wherein the signal transfer circuit is configured to receive the first signal and transfer the received first signal as a second signal swinging between a third voltage level and the ground level, wherein the signal transfer circuit comprises:
a first setting circuit configured to set the third voltage level to be same as the second voltage level when the first voltage level is higher than the second voltage level; and
a second setting circuit configured to set the third voltage level to be same as the first voltage level, by detecting when the first voltage level is lower than or equal to the second voltage level.

12. The semiconductor device according to claim 11, wherein the first setting circuit enters a mode for not disturbing an operation of the second setting circuit, when the first voltage level is lower than or equal to the second voltage level.

13. The semiconductor device according to claim 12, wherein the second setting circuit enters a mode for not disturbing an operation of the first setting circuit, by detecting when the first voltage level is higher than the second voltage level.

14. The semiconductor device according to claim 13, wherein the second setting circuit comprises:
a first switch configured to be controlled in response to a voltage level of a detection node between an input node for receiving the first signal and an output node for outputting the second signal; and
a detection circuit configured to set a voltage level of the detection node by detecting a difference between the first voltage level and the second voltage level.

15. The semiconductor device according to claim 14,
wherein the detection circuit sets the detection node to a voltage level for turning on the first switch, by detecting when the first voltage level is lower than or equal to the second voltage level, and
wherein the detection circuit sets the detection node to a voltage level for turning off the first switch, by detecting when the first voltage level is higher than the second voltage level.

16. The semiconductor device according to claim 15, wherein the second setting circuit further comprises:
a second switch configured to couple the input node and the output node by detecting when the first voltage level is lower than the second voltage level.

17. The semiconductor device according to claim 16, wherein the first setting circuit comprises:
a first NMOS transistor having a gate terminal which is coupled to the input node, a drain terminal to which the second operating power source is inputted, and a source terminal which is coupled to the output node.

18. The semiconductor device according to claim 17, wherein the first switch comprises:
a first PMOS transistor having a source terminal which is coupled to the input node, a gate terminal which is coupled to the detection node, and a drain terminal which is coupled to the output node.

19. The semiconductor device according to claim 18, wherein the second switch comprises:
a second NMOS transistor having a drain terminal which is coupled to the input node, a gate terminal to which the second operating power source is inputted, and a source terminal which is coupled to the output node.

20. The semiconductor device according to claim 19, wherein the detection circuit comprises:
a second PMOS transistor having a source terminal which is coupled to the input node, a gate terminal to which the second operating power source is inputted, and a drain terminal to which the detection node is coupled;
a third PMOS transistor having a source terminal to which the second operating power source is inputted, a gate terminal which is coupled to the input node, and a drain terminal to which a first intermediate node is coupled;
a fourth PMOS transistor having a source terminal which is coupled to the input node, a gate terminal to which the second operating power source is inputted, and a drain terminal to which the first intermediate node is coupled;
a third NMOS transistor having a drain terminal to which the detection node is coupled, a gate terminal to which the second operating power source is inputted, and a source terminal to which a first sinking node is coupled;
a fourth NMOS transistor having a drain terminal to which the second operating power source is inputted, a gate terminal which is coupled to the first intermediate node, and a source terminal to which a second intermediate node is coupled;
a fifth NMOS transistor having a drain terminal to which the first intermediate node is coupled, a gate terminal to which the second operating power source is inputted, and a source terminal to which the second intermediate node is coupled;
a fifth PMOS transistor having a source terminal to which the second operating power source is inputted, a gate terminal which is coupled to the second intermediate node, and a drain terminal to which a second sinking node is coupled;
a sixth NMOS transistor having a drain terminal to which the first sinking node is coupled and a gate terminal to which the second sinking node is coupled;
a seventh NMOS transistor having a drain terminal to which a source terminal of the sixth NMOS transistor is coupled and a gate terminal to which the second sinking node is coupled;
an eighth NMOS transistor having a drain terminal to which a source terminal of the seventh NMOS transistor is coupled, a gate terminal to which the first sinking node is coupled, and a source terminal to which a ground is coupled;
a ninth NMOS transistor having a drain terminal to which the second sinking node is coupled and a gate terminal to which the first sinking node is coupled; and
a tenth NMOS transistor having a drain terminal and a gate terminal to which a source terminal of the ninth NMOS transistor is coupled in common, and a source terminal which is coupled to the ground.

* * * * *